(12) United States Patent
Kim et al.

(10) Patent No.: US 9,768,209 B2
(45) Date of Patent: Sep. 19, 2017

(54) DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Yeun Tae Kim, Suwon-si (KR); Hyang-Shik Kong, Seongnam-si (KR); Namseok Roh, Seongnam-si (KR); Hongsick Park, Suwon-si (KR); Changoh Jeong, Suwon-si (KR); Jinho Ju, Seoul (KR); Byeong-Jin Lee, Yongin-si (KR); Kyungtae Chae, Hwaseong-si (KR); Jiseong Yang, Seoul (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 38 days.

(21) Appl. No.: 14/964,042

(22) Filed: Dec. 9, 2015

(65) Prior Publication Data
US 2016/0099265 A1    Apr. 7, 2016

Related U.S. Application Data

(62) Division of application No. 13/773,685, filed on Feb. 22, 2013, now Pat. No. 9,219,192.

(30) Foreign Application Priority Data

May 18, 2012    (KR) .................. 10-2012-0053294

(51) Int. Cl.
G02F 1/1333    (2006.01)
H01L 27/12    (2006.01)
(Continued)

(52) U.S. Cl.
CPC ........ H01L 27/1288 (2013.01); G02F 1/1341 (2013.01); G02F 1/133377 (2013.01);
(Continued)

(58) Field of Classification Search
CPC ................. H01L 27/1288; H01L 33/08; G02F 1/133377; G02F 1/133509;
(Continued)

(56) References Cited

U.S. PATENT DOCUMENTS 6,469,761 B1 * 10/2002 Drabik ................ G02F 1/13394
                                              349/122
7,236,220 B2    6/2007 Kim et al.
(Continued)

FOREIGN PATENT DOCUMENTS

CN    1633624    6/2005
CN    1316310    5/2007
(Continued)

*Primary Examiner* — Nathanael R Briggs
(74) *Attorney, Agent, or Firm* — F. Chau & Associates, LLC

(57) ABSTRACT

A display apparatus includes a base substrate, a pixel on the base substrate, and a color filter part between the base substrate and the pixel. The pixel includes a cover layer defining a TSC (Tunnel Shaped Cavity) on the base substrate, an image display part provided in the TSC, and first and second electrodes which apply an electric field to the image display part.

10 Claims, 44 Drawing Sheets

(51) Int. Cl.
*H01L 33/08* (2010.01)
*G02F 1/167* (2006.01)
*G02F 1/1335* (2006.01)
*G02F 1/1341* (2006.01)
*G02F 1/1362* (2006.01)
*G02F 1/137* (2006.01)

(52) U.S. Cl.
CPC .. *G02F 1/133509* (2013.01); *G02F 1/133512* (2013.01); *G02F 1/133516* (2013.01); *G02F 1/167* (2013.01); *H01L 33/08* (2013.01); *G02F 1/136209* (2013.01); *G02F 2001/13793* (2013.01); *G02F 2001/133357* (2013.01); *G02F 2001/136222* (2013.01)

(58) Field of Classification Search
CPC ......... G02F 1/133512; G02F 1/133516; G02F 1/1341; G02F 1/167; G02F 1/136209; G02F 2001/133357; G02F 2001/136222; G02F 2001/13793
See application file for complete search history.

(56) References Cited

U.S. PATENT DOCUMENTS

| 7,961,273 | B2 | 6/2011 | Moriya et al. |
| 2006/0146267 | A1 | 7/2006 | Choi et al. |
| 2008/0018845 | A1 | 1/2008 | Choi |
| 2008/0239215 | A1 | 10/2008 | Chae |
| 2010/0038648 | A1 | 2/2010 | Cho et al. |
| 2012/0062448 | A1 | 3/2012 | Kim et al. |

FOREIGN PATENT DOCUMENTS

| JP | 2001519049 | 10/2001 |
| JP | 2006189763 | 7/2006 |
| JP | 2010211136 | 9/2010 |
| JP | 2010256931 | 11/2010 |
| JP | 2011257528 | 12/2011 |
| KR | 10-2009-0000948 | 1/2009 |
| KR | 10-2012-0026880 | 3/2012 |
| WO | 98/45751 | 10/1998 |

* cited by examiner

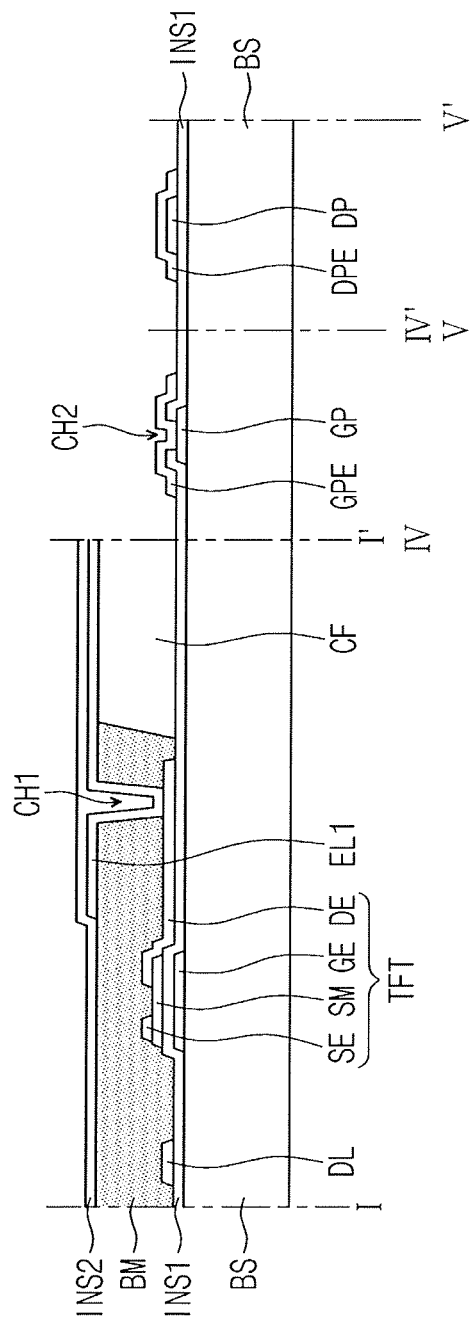

DISPLAY APPARATUS AND METHOD OF MANUFACTURING THE SAME

CROSS-REFERENCE TO RELATED APPLICATION

This divisional application claims priority to U.S. patent application No. 13/773,685, filed on Feb. 22, 2013, which claims priority to Korean Patent Application No. 10-2012-0053294 filed on May 18, 2012, the contents of which are herein incorporated by reference in their entirety.

TECHNICAL FIELD

Embodiments of the present invention relate to a display apparatus and a method of manufacturing the display apparatus.

DISCUSSION OF THE RELATED ART

Display apparatuses, such as liquid crystal displays or electrophoretic displays, may be used instead of cathode ray tubes.

A display apparatus includes two base substrates positioned opposite to each other and an image display unit, such as a liquid crystal layer or an electrophoretic layer, interposed between the two base substrates. The two base substrates are joined to each other with a gap provided between the two base substrates, and the image display unit can be disposed in the gap.

When manufacturing the display apparatus, a spacer is formed on one of the two base substrates so that the two base substrates are spaced apart from each other, and the spacer is attached to the other base substrate by an adhesive.

Accordingly, the process of manufacturing the display apparatus may be complicated.

SUMMARY

Exemplary embodiments of the present invention provide a method of manufacturing a display apparatus that may simplify the manufacturing process and may reduce the manufacturing cost and the defect rate and a display apparatus manufactured by the method.

According to an embodiment, a display apparatus includes a base substrate, a pixel on the base substrate, and a color filter part between the base substrate and the pixel. The color filter part includes a color filter corresponding to the pixel and a black matrix on at least one side of the color filter.

The pixel includes a cover layer that defines a TSC (Tunnel Shaped Cavity) on the base substrate, an image display part provided in the TSC, and first and second electrodes which are insulated each other and apply an electric field to the image display part.

In an exemplary embodiment of the present invention, the second electrode may be positioned opposite to the first electrode with the image display part disposed between the first and second electrodes. In an exemplary embodiment of the present invention, the first and second electrodes are provided between the image display part and the color filter part.

The first electrode may include a plurality of first branches, the second electrode may include a plurality of second branches, and the first branches and the second branches may be arranged alternately. Alternatively, the first electrode may have a single-plate shape, the second electrode may have a plurality of branches, and the branches may be overlapped with the first electrode in a plan view.

The cover layer may include a transparent material.

In an exemplary embodiment of the present invention, the display apparatus further includes an inorganic insulating layer between the image display part and the cover layer.

The image display part may include a liquid crystal layer or an electrophoretic layer. When the image display part is the liquid crystal layer, the liquid crystal layer includes liquid crystal, such as nematic liquid crystal, blue-phase liquid crystal, or cholesteric liquid crystal.

In an exemplary embodiment of the present invention, a thin film transistor may be provided between the base substrate and the color filter part and operates the pixel.

In an exemplary embodiment of the present invention, a method of manufacturing of a display apparatus includes forming a first electrode, forming a sacrificial layer extending in one direction, forming a second electrode extending in second direction crossing the first direction, forming a cover layer to cover the second electrode, wet-etching the sacrificial layer to form a TSC and the second electrode, forming an image display part in the TSC, and forming an insulating layer to cover the second electrode and to seal the TSC.

In an exemplary embodiment of the present invention, a color filter part including a color filter and a black matrix may be formed before forming the first electrode.

The second electrode may be formed by forming a conductive layer on the sacrificial layer, coating a positive type photo-resist on the conductive layer, exposing and developing the photo-resist to form an photo-resist pattern, patterning the conductive layer using the photo-resist pattern as a mask, and removing the photo-resist pattern. According to an embodiment, the sacrificial layer may include a negative type photo-resist, and the cover layer may include a positive type photo-resist.

In an exemplary embodiment of the present invention, the method of manufacturing of the display apparatus includes forming a color filter part including a color filter and a black matrix and forming a pixel on the color filter part. The forming the pixel includes forming a first electrode, forming an electrode part including a first electrode and a second electrode insulated from the first electrode, forming a sacrificial layer extending in a first direction on the electrode part, forming a cover layer extending in a second direction crossing the first direction on the sacrificial layer, wet-etching the sacrificial layer to form a TSC, forming an image display part in the TSC, and forming a sealing layer to cover the cover layer and to seal the TSC. According to an embodiment, the sacrificial layer may include a positive type photo-resist and the cover layer may include a negative type photo-resist.

According to an embodiment, there is provided a display apparatus including a base substrate, a first electrode on the base substrate, a second electrode on the first electrode, a cover layer on the second electrode, which the cover layer defines a tunnel shaped cavity, and an image display part in the tunnel shaped cavity.

The tunnel shaped cavity is formed between the first and second electrodes. The tunnel shaped cavity is formed on the second electrode.

The display apparatus includes a color filter between the base substrate and the first electrode. The display apparatus further includes a black matrix formed at a side of the color filter. The display apparatus further includes a black matrix on the cover layer.

According to the exemplary embodiments of the present invention, the manufacturing time and costs for the display apparatus can be reduced, resulting in a larger display apparatus.

BRIEF DESCRIPTION OF THE DRAWINGS

The embodiments of the present invention will become readily apparent by reference to the following detailed description when considered in conjunction with the accompanying drawings wherein:

FIGS. 4B, 5B, 6B, 7B, and 8B are sectional views taken along lines I-I', IV-IV', and V-V' of FIGS. 4A, 5A, 6A, 7A, and 8A, respectively.

FIGS. 25, 26, 27A to 35A, and 27B to 35B are sectional views showing a display apparatus according to an embodiment of the present invention.

DESCRIPTION OF THE EMBODIMENTS

Figure 1A:
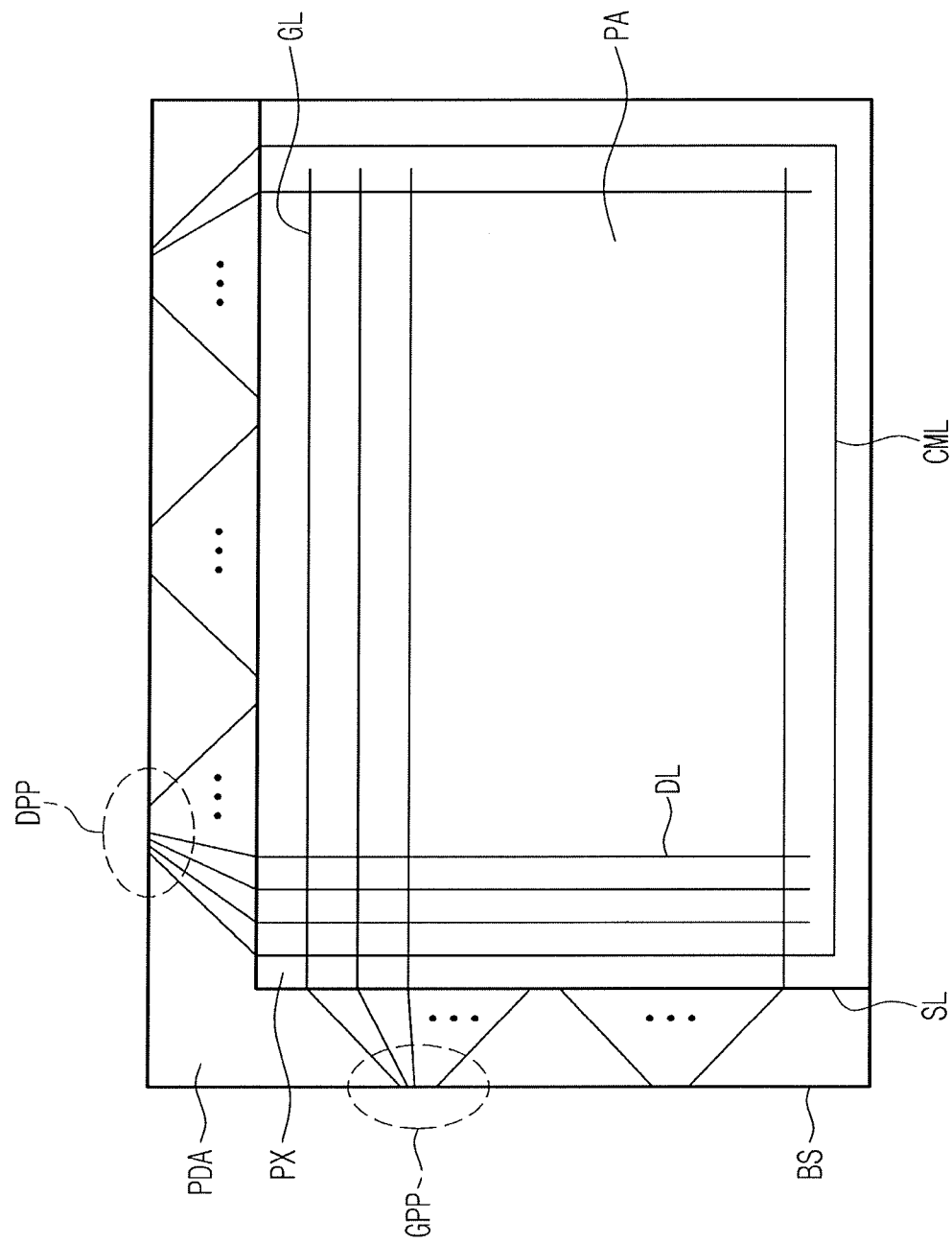
FIG. 1A is a plan view showing a display apparatus according to an embodiment of the present invention.

Hereinafter, exemplary embodiments of the present invention will be described in detail with reference to the accompanying drawings, wherein the same reference numerals may be used to denote the same or substantially the same elements throughout the specification and the drawings. However, the present invention is not limited to the following embodiments but can include various changes, substitutions and/or modifications within the technical scope of the present invention.

In the drawings, the sizes of layers and regions can be magnified for the purpose of clear explanation. Unless the context otherwise requires, the singular expression does not exclude the plural expression.

It will be understood that when an element, such as a layer, a film, a region, or a plate, is referred to as being 'on' or 'under' another element, the element can be directly on another element or intervening element may also be present therebetween.

Figure 1B:
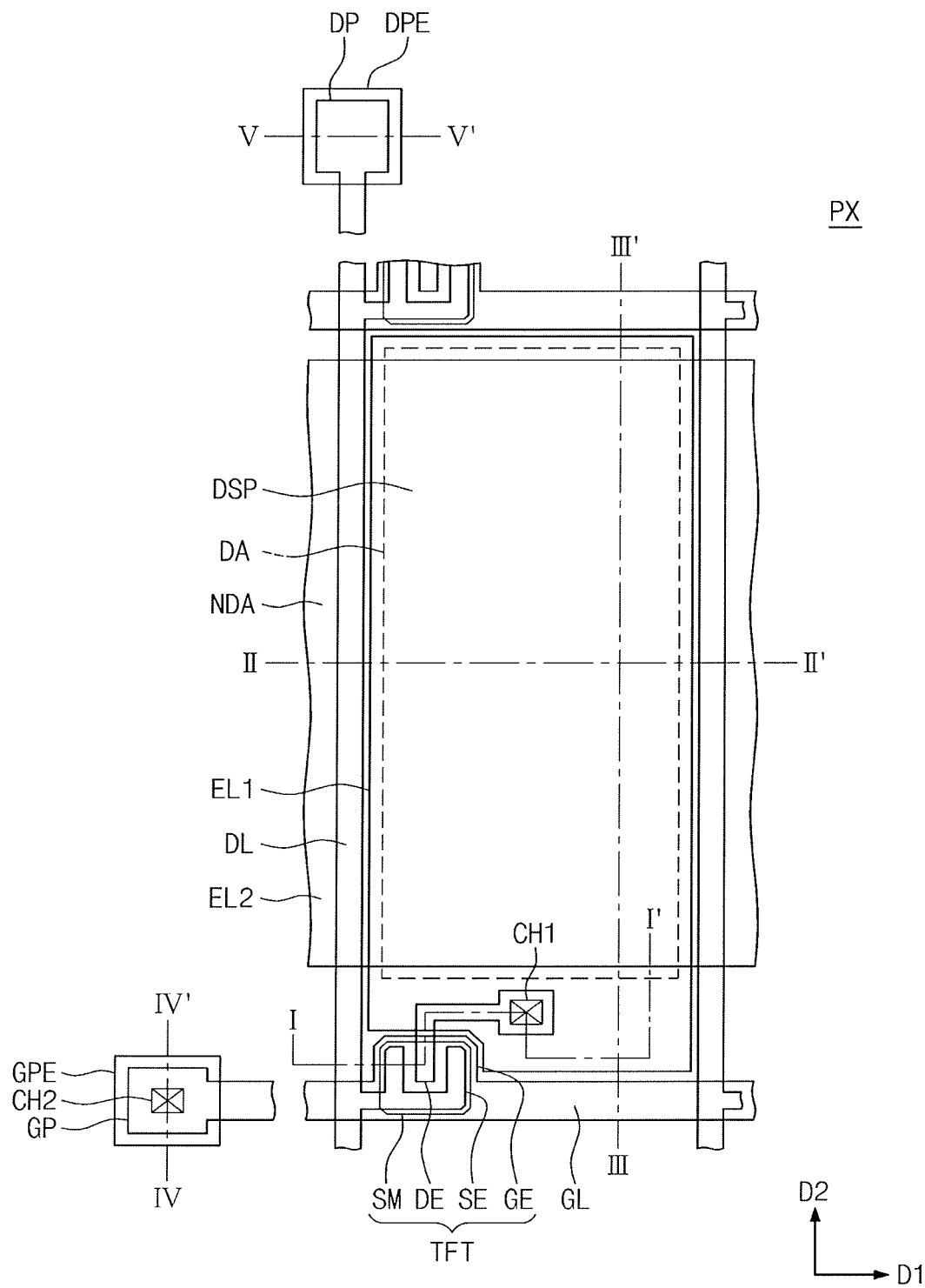
FIG. 1B is a plan view showing a part of the display apparatus shown in FIG. 1A.
Figure 2A:
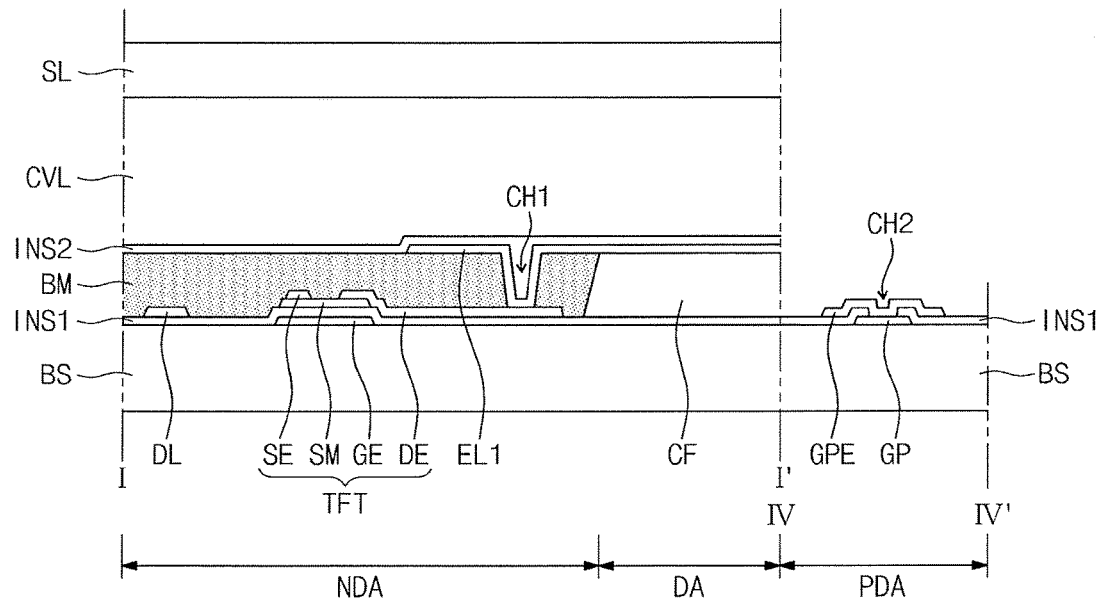
FIG. 2A is a sectional view taken along lines I-I' and IV-IV' of FIG. 1B.

FIG. 1A is a plan view showing a display apparatus according to an embodiment of the present invention. FIG. 1B is a plan view showing a part of the display apparatus shown in FIG. 1A. FIG. 2A is a sectional view taken along lines I-I' and IV-IV', FIG. 2B taken along line II-II', and FIG. 2C taken along lines III-III' and V-V', of FIG. 1B, respectively.

Referring to FIG. 1A, a display apparatus according to an exemplary embodiment of the present invention includes a plurality of pixels PX. The pixels PX are arranged in the form of a matrix having a plurality of rows and a plurality of columns. The pixels PX have the same or substantially the same structure as each other. For purposes of description, one pixel is hereinafter described. In FIGS. 1B, 2A, 2B, and 2C, only one pixel is illustrated. As illustrated in FIGS. 1B, 2A, 2B, and 2C, the pixel has a rectangular shape extending in one direction, but is not limited thereto. For example, according to an embodiment, the pixel has a V shape or Z shape.

Referring to FIGS. 1A, 1B, 2A, 2B, and 2C, the display apparatus includes a base substrate BS, a color filter part and a pixel PX provided on the base substrate BS.

The base substrate BS includes a transparent or opaque insulating base substrate. According to an embodiment, the base substrate BA includes silicon, glass, or plastic. The base substrate BS includes a pixel area PA in which the pixels PX are arranged and a pad area PDA which is provided on at least one side of the pixel area PA. The pixel area PA includes a display area DA corresponding to a pixel PX to display an image, and a non-display area NDA except the display area DA. The non-display area NDS is provided on at least one side of the display area DA.

A wiring part through which signals are transferred and a thin film transistor TFT to operate the pixel PX are disposed on the base substrate BS. The wiring part and the thin film transistor TFT are disposed in the non-display area NDA.

The wiring part includes a gate line GL, a data line DL, a common voltage line CML on the non-display area NDA, and a gate pad part GPP and a data pad part DPP on the pad area PDA. The gate pad part GPP and the data pad part DPP will be described below.

The gate line GL extends in a first direction D1 on the base substrate BS.

The data line DL is insulated from the gate line GL, and a first insulating layer INS1 is disposed between the data line DL and the gate line GL. The first insulating layer INS1 is disposed on the gate line GL. The first insulating layer includes insulating materials, such as silicon nitride or silicon oxide. The data line DL extends in a second direction D2 crossing the first direction D1.

The common voltage line CML is provided along at least a portion of a border of the pixel area PA in the non-display area NDA, e.g., in a shape of encompassing the pixel area PA. According to an embodiment, the common voltage line CML includes the same or substantially the same material as the gate line GL.

The thin film transistor TFT is connected to the gate line GL and the data line DL, and includes a gate electrode GE, a semiconductor layer SM, a source electrode SE, and a drain electrode DE.

The gate electrode GE protrudes from the gate line GL or is provided on part of the gate line GL. According to an embodiment, the gate line GL and the gate electrode GE include a metal. The gate line GL and the gate electrode GE include at least one of nickel, chromium, molybdenum, aluminum, titanium, copper, tungsten, and alloys thereof. According to an embodiment, the gate line GL and the gate electrode GE are formed in a single layer or a multilayer structure using the metal. For example, according to an embodiment, the gate line GL and the gate electrode GE include a triple metal layer structure in which a molybdenum layer, an aluminum layer, and a molybdenum layer are stacked subsequently. Alternatively, the gate line GL and the gate electrode GE include a single metal layer which includes an alloy of titanium and copper.

The first insulating layer INS1 is disposed on a top surface of the base substrate BS and covers the gate electrode GE.

The semiconductor layer SM is provided on the gate electrode GE, and the first gate insulating layer INS1 is disposed between the semiconductor layer SM and the gate electrode GE. The source electrode SE protrudes from the data line DL and overlaps the semiconductor layer SM. The drain electrode DE is spaced apart from the source electrode SE on the semiconductor layer SM. The semiconductor layer SM, together with the source electrode SE and the drain electrode DE, constitutes a conductive channel.

According to an embodiment, the source electrode SE and the drain electrode DE each include a conductive material, for example, metal. According to an embodiment, each of the source electrode SE and the drain electrode DE is formed of a single metal, but is not limited thereto. For example, according to an embodiment, each of the source electrode SE and the drain electrode DE is formed of at least two kinds of metals, or alloys of at least two kinds of metals. According to an embodiment, the metals include at least one of nickel, chromium, molybdenum, aluminum, titanium, copper, tungsten, and alloys thereof. According to an embodiment, each of the source electrode SE and the drain electrode DE are formed in a single layered or a multilayered structure. For example, according to an embodiment, the source electrode SE and the drain electrode DE have a double-layered metal structure which includes a titanium layer and a copper layer.

The color filter part is provided on the thin film transistor TFT, and a first contact hole CH1 is provided in the color filter part. The first contact hole CH1 exposes a portion of the drain electrode DE of the thin film transistor TFT. The color filter part includes a color filter CF and a black matrix BM.

The color filter CF allows light passing through each pixel to provide a color. According to an embodiment, the color filter CF includes one of a red color filter, a green color filter, and a blue color filter and corresponds to a pixel of the pixel area PA. According to an embodiment, the color filter CF further includes another color filter having a color except red, green, and blue. For example, the color filter CF further includes a white color filter. When a plurality of pixels PX are provided, a plurality of color filters CF are provided. The pixels PX having different color filters CF are arranged so that the pixels PX adjacent to each other have different colors from each other. According to an embodiment, portions of the color filters CF adjacent to each other overlap each other at the border of the pixels PX.

The black matrix BM is disposed on the non-display area NDA and blocks light unnecessary for displaying an image. The black matrix BM blocks light leakages caused by abnormal behaviors of liquid crystal molecules and decreases color mixing caused by two adjacent color filters CF overlapping each other at the border of the pixels PX. According to an embodiment, the black matrix BM is provided on at least one side of the color filter CF or surrounds the color filter CF along the border of the color filter.

According to an embodiment, a protection layer is provided between the color filter part and the thin film transistor TFT to protect a conductive channel of the thin film transistor TFT. The protection layer covers an exposed top surface of the semiconductor layer SM.

The pixel PX is provided on the base substrate BS, for example, on the color filter part. The pixel PX includes a cover layer CVL which defines a TSC (Tunnel Shaped Cavity) on the base substrate BS, an image display part DSP provided in the TSC, and a first and second electrodes EL1 and EL2 which control the image display part DSP.

The first electrode EL1 is provided on the color filter part. The first electrode EL1 is connected with the thin film transistor TFT through the first contact hole CH1 in the color filter part. A second insulating layer INS2 is disposed on the first electrode EL1 to protect the first electrode EL1. According to an embodiment, the second insulating layer INS2 is omitted. According to an embodiment, the second insulating layer INS2 includes inorganic or organic insulating materials.

In an exemplary embodiment of the present invention, although the contact hole CH1 is formed by opening a portion of an area where the black matrix BM is formed, forming the contact hole CH1 is not limited thereto. For example, alternatively, the first contact hole CH1 is formed by opening a portion of the color filter CF.

The cover layer CVL extends in the first direction D1 on the first electrode EL1, substantially on the second insulating layer INS2. The cover layer CVL, a portion of which is spaced apart from the top surface of the color filter part, defines the TSC together with the color filter part. For example, the cover layer CVL is spaced apart from the second insulating layer INS2 in an upper direction in the display area DA to provide a space (or cavity) between the second insulating layer INS2 and the cover layer CVL. The cover layer CVL does not provide any space between the second insulating layer INS2 and the cover layer CVL in the non-display area NDA along the second direction D2. As a consequence, the TSC has a shape of extending in the second direction D2. Two ends of the TSC, e.g., one end of the TSC in the second direction D2 and another end of TSC in an opposite direction of the second direction D2, are opened since the cover layer CVL is not formed on areas corresponding to the two ends. However, the extending direction of the cover layer CVL is not limited thereto, and according to an embodiment, the cover layer CVL may extend in a different direction from the first direction D1.

The second electrode EL2 is disposed along the bottom surface of the cover layer CVL and extends in the same or substantially the same extending direction as the cover layer CVL, e.g., the first direction D1. The second electrode EL2 forms an electric field together with the first electrode EL1. When a plurality of pixels PX are provided, the pixels PX are arranged in the first direction D1 and share the second electrode EL2. The second electrode EL2 is spaced apart from the second insulating layer INS2 in the upper direction in the display area DA and directly contacts the second insulating layer INS2 in the non-display area NDA.

The second electrode EL2 is connected with the common voltage line CML in the non-display area NDA. According to an embodiment, the first insulating layer INS1, the black matrix BM, and the second insulating layer INS2 are sequentially stacked on the common voltage line CML and an opening (not shown) is formed through the first insulating layer INS1, the black matrix BM, and the second insulating layer INS2 to expose a portion of the common voltage line CML. According to an embodiment, openings are provided to expose a plurality of portions of the common voltage line CML in the shape of holes, but not limited thereto. Alternatively, the opening is shaped as a slit along the common voltage line CML to longitudinally expose the common voltage line CML. The second electrode EL2 is directly connected with the common voltage line CML through the opening and receives the common voltage from the common voltage line CML.

The first and second electrodes EL1 and EL2 each include a transparent conductive material or an opaque conductive material, e.g., metal. According to an embodiment, the transparent or opaque conductive material for each of the first and second electrodes EL1 and EL2 is selected according to an operating mode of the display apparatus. For example, according to an embodiment, when the display apparatus operates as a transmissive display apparatus which has a back light unit under the base substrate BS, the first electrode EL1 and the second electrode E2 are formed of a transparent conductive material. Alternatively, when the display apparatus according to an embodiment of the present invention operates as a reflective display apparatus which has no light source, the first electrode EL1 and the second electrode EL2 are formed of a opaque conductive material (e.g., a reflective opaque conductive material) and a transparent conductive material, respectively. According to an embodiment, the transparent conductive material includes a transparent conductive oxide, such as ITO (indium tin oxide), IZO (indium zinc oxide), or ITZO (indium tin zinc oxide). According to an embodiment, the opaque conductive material includes metal, for example, at least one of nickel, chromium, molybdenum, aluminum, titanium, copper, tungsten, or alloys thereof. According to an embodiment, at least one of the elements other than the first and second electrodes EL1 and EL2 among the elements illustrated in FIGS. 1A to 2C, e.g., the cover layer CVL, is transparent or opaque according to the operation mode of the display apparatus.

The image display part DSP is provided in the TSC. According to an embodiment of the present invention, the image display part DSP is disposed between the first electrode EL1 and the second electrode EL2 which face each other and is controlled by an electric field, resulting in displaying an image. According to an embodiment, the image display part DSP is not limited to a specific type as long as the image display part can display an image using an electric field. According to an embodiment, the image display part DSP has a liquid phase. For example, according to an embodiment, the image display part DSP includes an electrophoretic layer or a liquid crystal layer.

When the image display part DSP includes the electrophoretic layer, the electrophoretic layer includes an insulating medium and charged particles. The charged particles have electrophoretic properties and are dispersed in the insulating medium. The insulating medium is a dispersing medium in which the charged particles are dispersed. The charged particles move according to the electric field applied to the charged particles and transmit or block light passing through the electrophoretic layer, resulting in displaying an image.

When the image display part DSP includes the liquid crystal layer, the liquid crystal layer includes liquid crystal molecules having optical anisotropy. The liquid crystal molecules are operated by an electric field and transmit or block light passing through the liquid crystal layer, resulting in displaying an image. According to an embodiment, an alignment layer is formed on a top surface of the second insulating layer INS2 and a bottom surface of the second electrode EL2 in the TSC. The alignment layer pre-tilts the liquid crystal molecules. Alternatively, the alignment layer is omitted according to a structure of the first and second electrodes EL1 and EL2, or a type of the liquid crystal layer. For example, according to an embodiment, when the first and second electrodes EL1 and EL2 have directors, such as slits or protrusions, the alignment layer is omitted.

According to an embodiment, an inorganic insulating layer is further provided between the image display part DSP and the second electrode EL2 and/or between the second electrode EL2 and the cover layer CVL. According to an embodiment, the inorganic insulating layer includes a silicon nitride or a silicon oxide. The inorganic insulating layer supports the cover layer CVL so that the cover layer CVL stabilizes the TSC.

A sealing layer SL is disposed on the cover layer CVL. The sealing layer covers the pixel area PA. According to an embodiment, the sealing layer SL covers the display area DA and the non-display area NDA other than the pad area PDA. The sealing layer SL seals the openings located at two ends of the TSC and seals the TSC. The space or cavity is sealed by the second insulating layer INS2 (or the first electrode EL1 when the second insulating layer INS2 is omitted), the second electrode EL2, and the sealing layer SL.

The gate pad part GPP and the data pad part DPP are disposed in the pad area PDA. The gate pad part GPP includes a gate pad GP and a gate pad electrode GPE connected with the gate pad GP. The gate pad GP is disposed on the base substrate BS and is connected with the corresponding gate line GL. The color filter part, e.g., the black matrix BM is not formed on the gate pad part GPP. The gate pad electrode GPE is connected with the gate pad GP through a second contact hole CH2 formed in the first insulating layer INS1.

The data pad part DPP includes a data pad DP and a data pad electrode DPE connected with the data pad DP. The data pad DP is disposed on the first insulating layer INS1 and connected with corresponding data line DL. The color filter part, e.g., the black matrix BM is not formed on the data pad part DPP. The data pad electrode DPE is disposed on the data pad DP and directly contacted with the data pad DP. In an embodiment of the present invention, the data pad electrode DPE is omitted. In an embodiment of the present invention, an additional insulating layer with a through hole is provided on the data pad DP, so that the data pad electrode DPE may be connected with the data pad DP through the through hole.

According to an embodiment of the present invention, the gate pad part GPP and the data pad part DPP are electrically connected with exterior wires, but are not limited thereto. In an embodiment of the present invention, a gate driver including a plurality amorphous silicon transistors is provided instead of the gate pad part GPP. According to an embodiment, the amorphous silicon transistors are directly mounted on the base substrate BS in the pad area PDA through a process of fabricating the thin film transistors.

According to an embodiment, polarizers (not shown) are respectively disposed on a rear surface of the base substrate BS and on the sealing layer SL. When the polarizer on the rear surface of the base substrate BS is referred to as a first polarizer and the polarizer on the sealing layer SL is referred to as a second polarizer, light passing through the first polarizer and light passing through the second polarizer are polarized substantially perpendicular to each other.

In an embodiment of the present invention, when a gate signal is transferred to the gate electrode GE through the gate line GL and a data signal is transferred to the source electrode SE through the data line DL, a conductive channel is formed in the semiconductor layer SM. As a consequence, the thin film transistor TFT is turned on so that the data signal is provided to the first electrode EL1, and an electric field is generated between the first electrode EL1 and the second electrode EL2. The image display part DSP is operated by the electric field, resulting in displaying an image according to the amount of light passing through the image display part DSP.

Figure 2B:
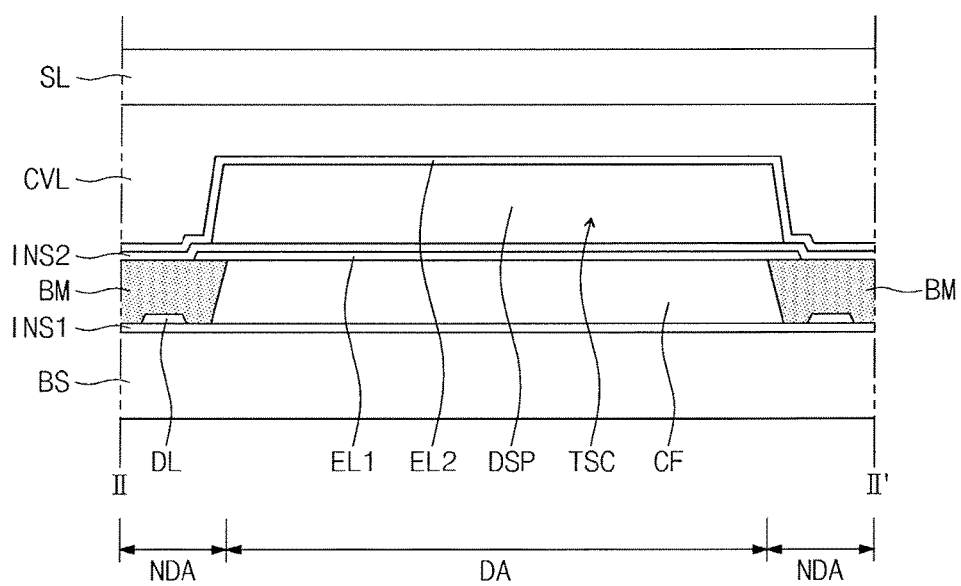
FIG. 2B is a sectional view taken along line II-II' of FIG. 1B.
Figure 2C:
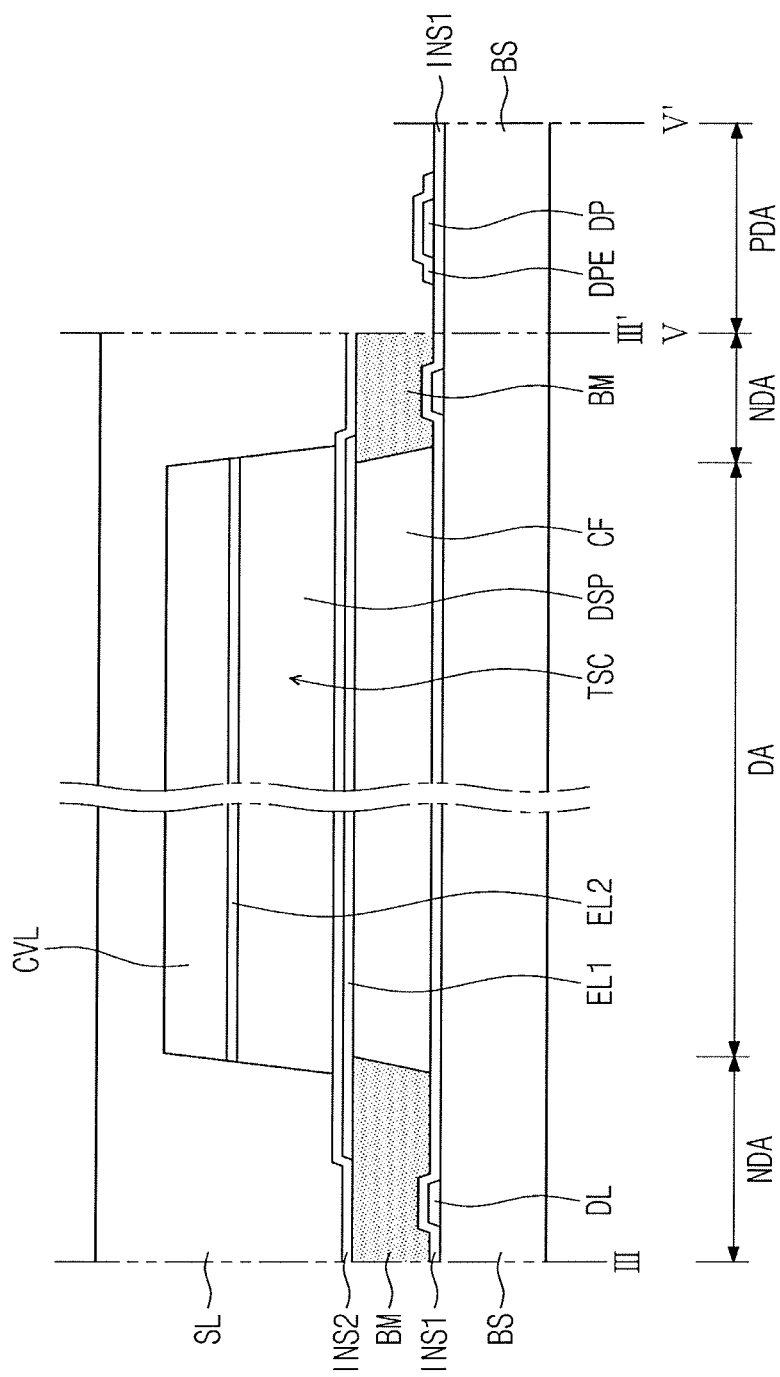
FIG. 2C is a sectional view taken along lines III-III' and V-V' of FIG. 1B.
Figure 3:
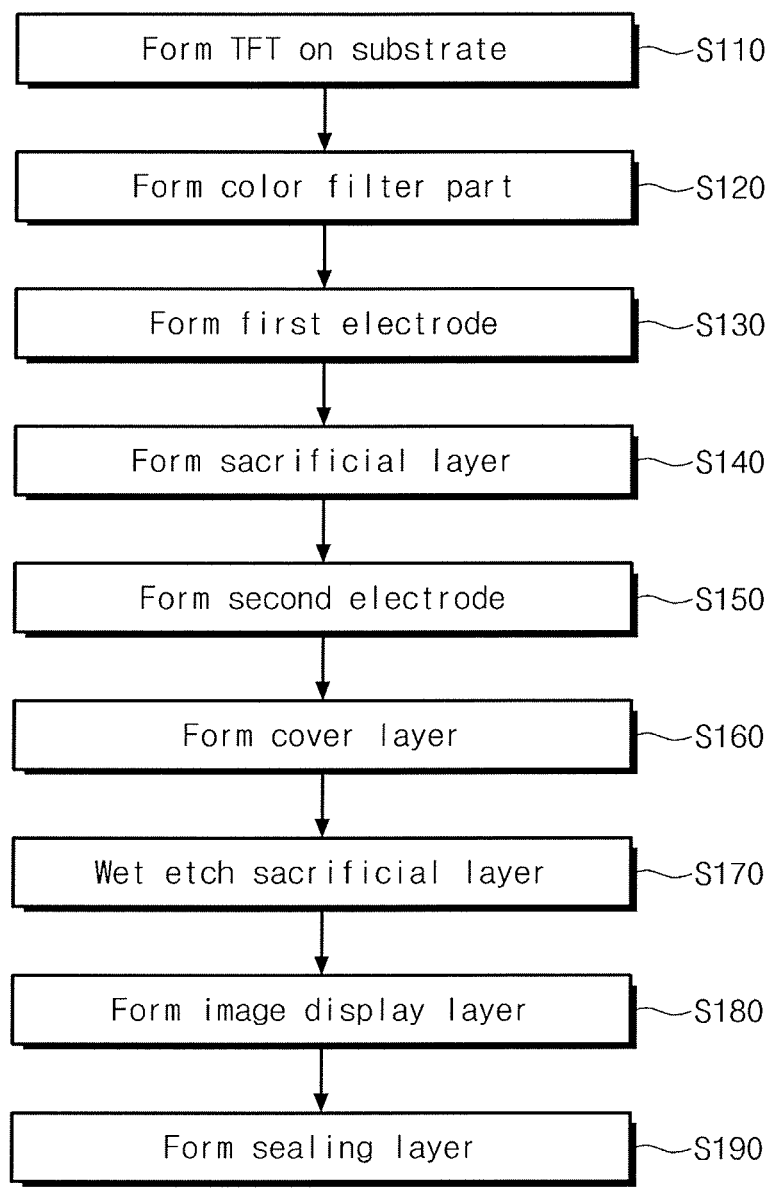
FIG. 3 is a flowchart showing a method of manufacturing a display apparatus according to an embodiment of the present invention.

FIG. 3 is a flowchart showing a method of manufacturing a display apparatus as shown in FIGS. 2A to 2C according to an embodiment of the present invention.

Referring to FIG. 3, a thin film transistor TFT and a color filter part are formed on a base substrate BS (S110, S120). Next, a first electrode EL1, a sacrificial layer SCR_N, a second electrode EL2, and a cover layer CVL are formed sequentially on the color filter part (S130, S140, S150, S160) and then the sacrificial layer SCR_N is removed (S170). After an image display part DSP is formed (S180), a sealing layer SL is formed to seal the image display part DSP (S190). Hereinafter, with respect to photosensitive materials, the suffix "_N" indicates a negative type and the suffix "_P" indicates a positive type.

FIGS. 4A, 5A, 6A, 7A, and 8A are plan views showing a part of a display apparatus according to an embodiment of the present invention as shown in FIGS. 2A to 2C and 3. FIGS. 4B, 5B, 6B, 7B, and 8B are sectional views taken along lines I-I', IV-IV', and V-V' of FIGS. 4A, 5A, 6A, 7A, and 8A, respectively. FIGS. 9A, 10A, 11A, 12A, 13A, 14A, and 15A are sectional views taken along the line II-II' of FIG. 8A. FIGS. 9B, 10B, 11B, 12B, 13B, 14B, and 15B are sectional views taken along the line III-III' of FIG. 8A.

Figure 4A:
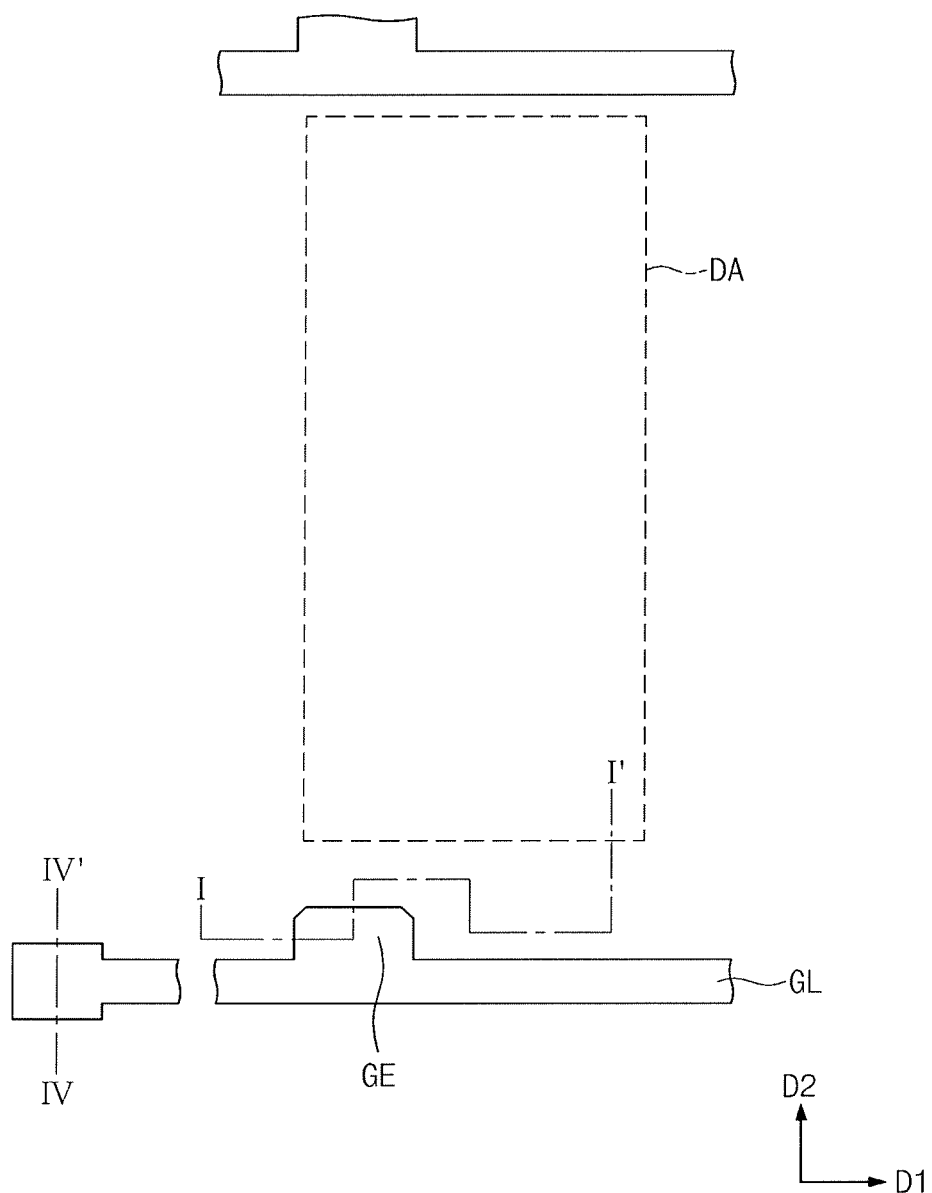
FIGS. 4A, 5A, 6A, 7A, and 8A are plan views showing a process of manufacturing a display apparatus according to an embodiment of the present invention.
Figure 4B:
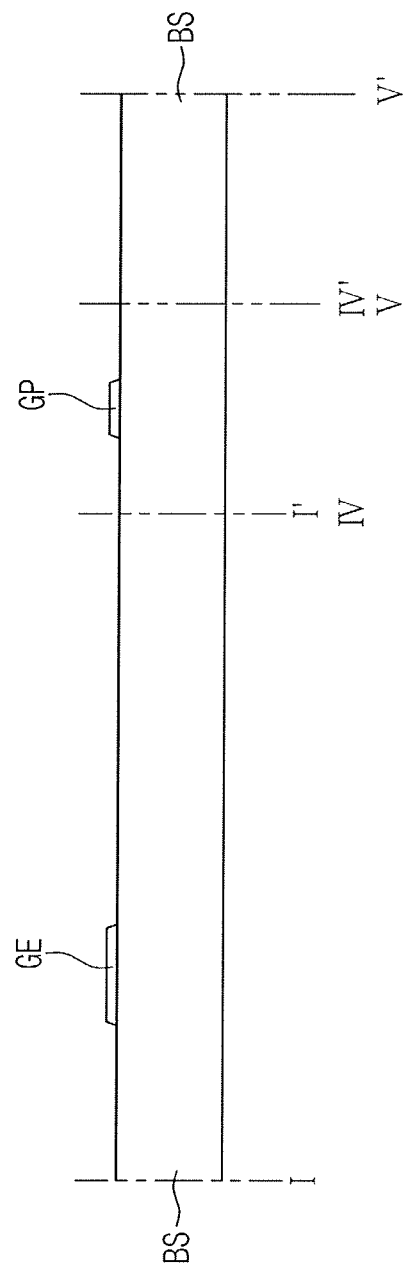

Referring to FIGS. 4A and 4B, a gate wire is formed on a base substrate BS. The gate wire includes a gate line GL, a gate electrode GE, a gate pad GP, and a common voltage line (CML) (not shown).

According to an embodiment, the gate wire is formed of a conductive material, such as a metal. According to an embodiment, the gate wire is formed in a single process by forming a metal layer on the base substrate BS and patterning the metal layer using a photolithography process. According to an embodiment, the gate wire is formed in a single layer including a single metal or an alloy, but is not limited thereto. Alternatively, the gate wire is formed in multiple layers including at least two kinds of metals and/or alloys thereof.

Figure 5A:
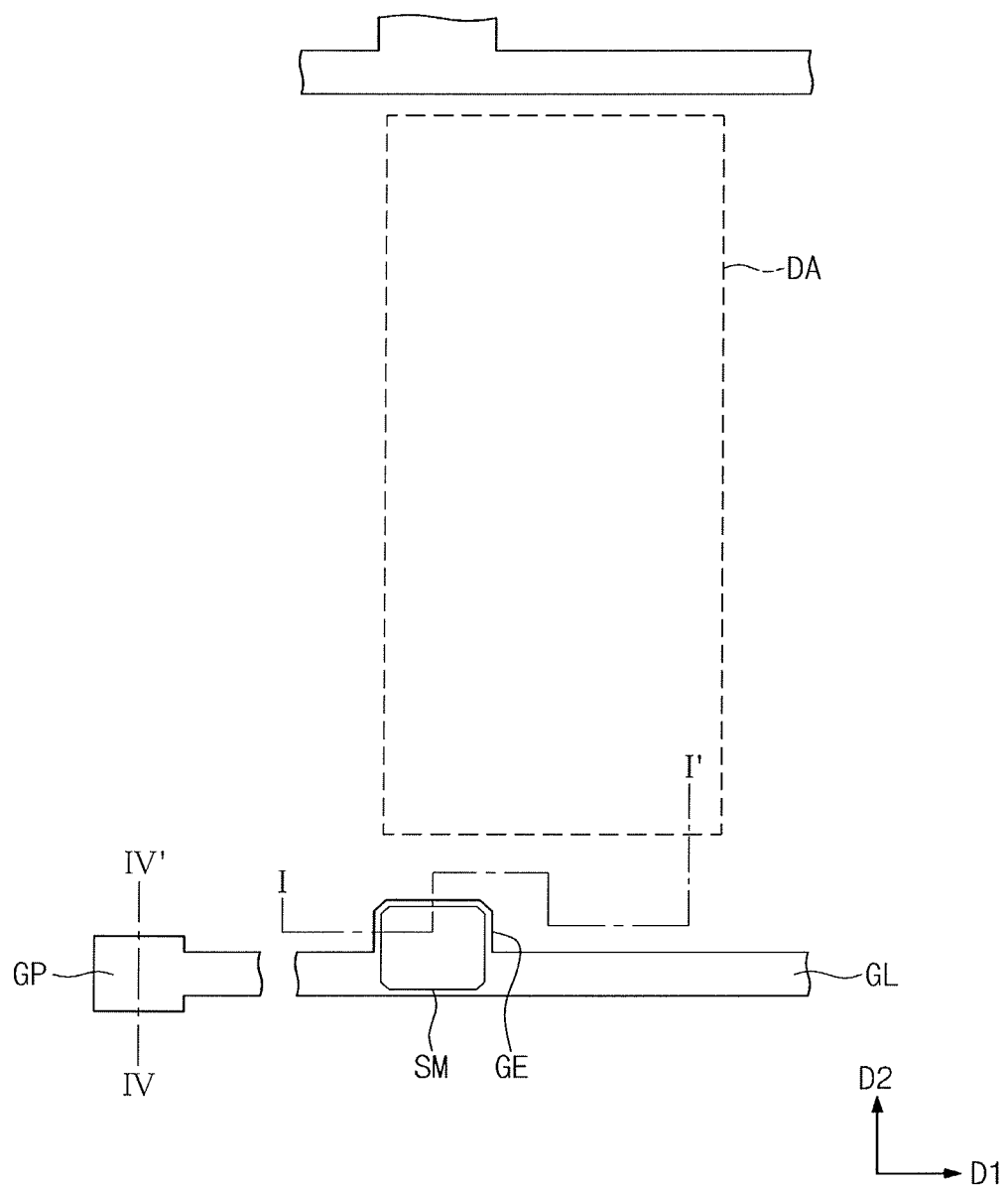
Figure 5B:
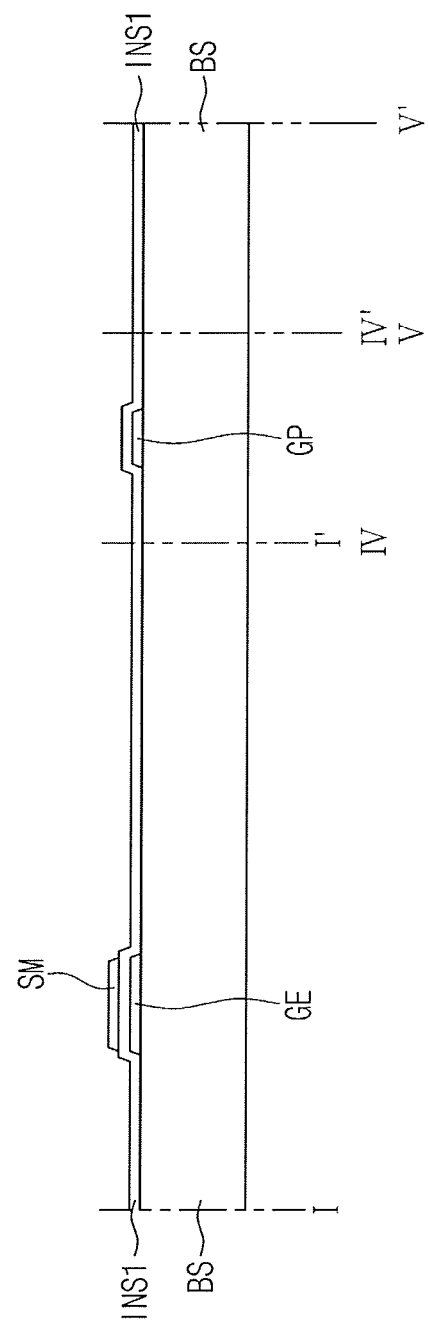

Referring to FIGS. 5A and 5B, a first insulating layer INS1 is formed on the gate wire, and a semiconductor layer SM is formed on the first insulating layer INS1. The semiconductor layer SM is disposed on the gate electrode GE and overlaps at least a portion of the gate electrode GE in a plan view. According to an embodiment, the semiconductor layer SM includes doped or undoped silicon, or oxide semiconductor.

Figure 6A:
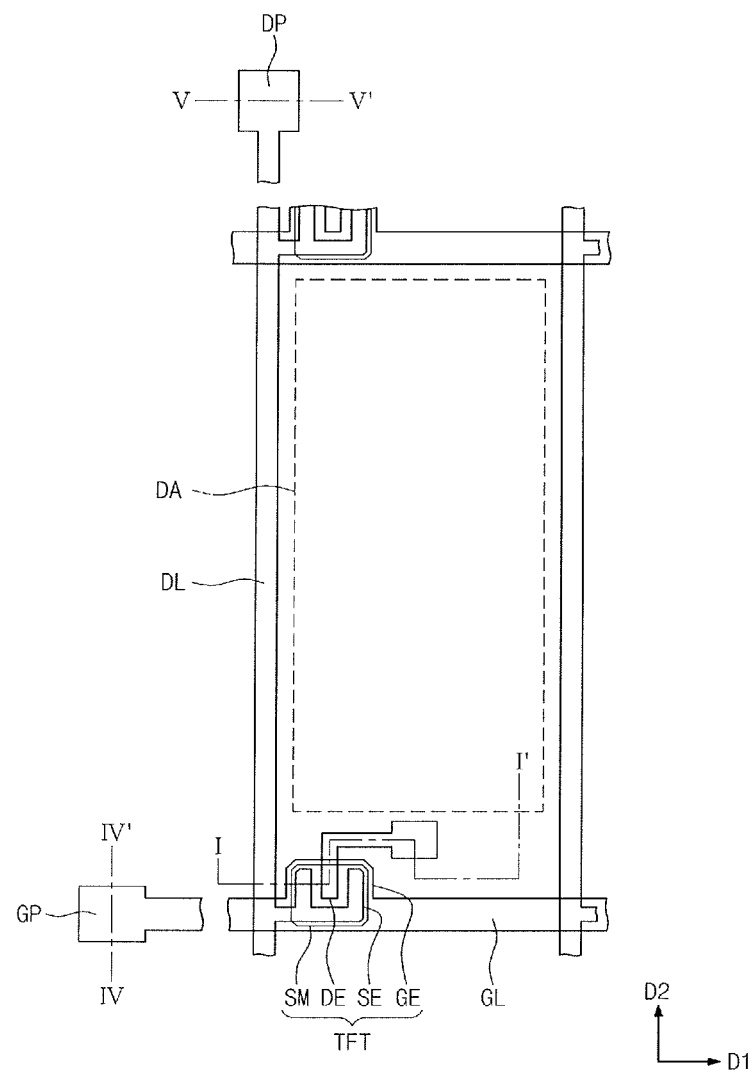
Figure 6B:
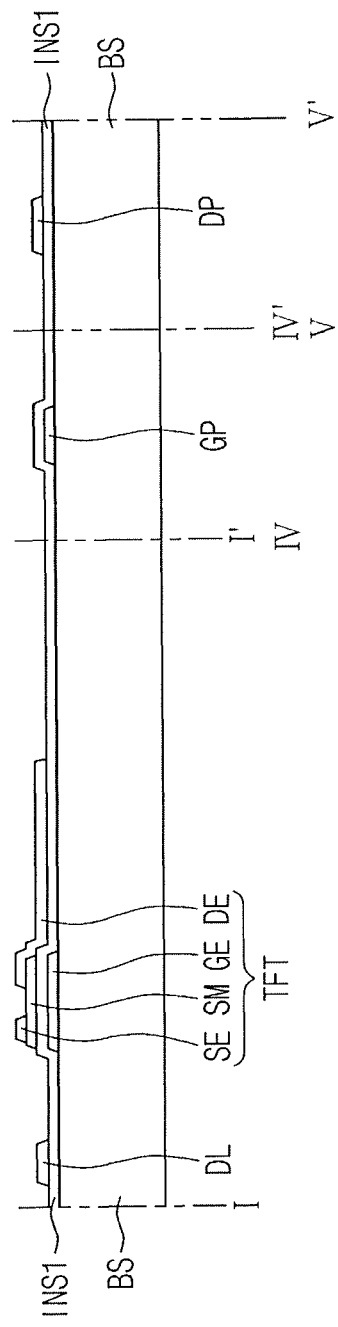

Referring to FIG. 3 and FIGS. 6A and 6B, a data wire is formed on the semiconductor layer SM. The data wire includes a data line DL, a source electrode SE, a drain electrode DE, and a data pad DP.

According to an embodiment, the data wire is formed of a conductive material, such as a metal. According to an embodiment, the data wire is formed in a single process by forming a metal layer on the base substrate BS and patterning the metal layer using a photolithography process. According to an embodiment, the data wire is formed in a single layer including a single metal or an alloy, but not limited thereto. Alternatively, the data wire is formed in multiple layers including at least two kinds of metals and/or alloys thereof.

The gate electrode GE, the source electrode SE, the drain electrode DE, and the semiconductor layer SM constitute a thin film transistor TFT (S110).

Figure 7A:
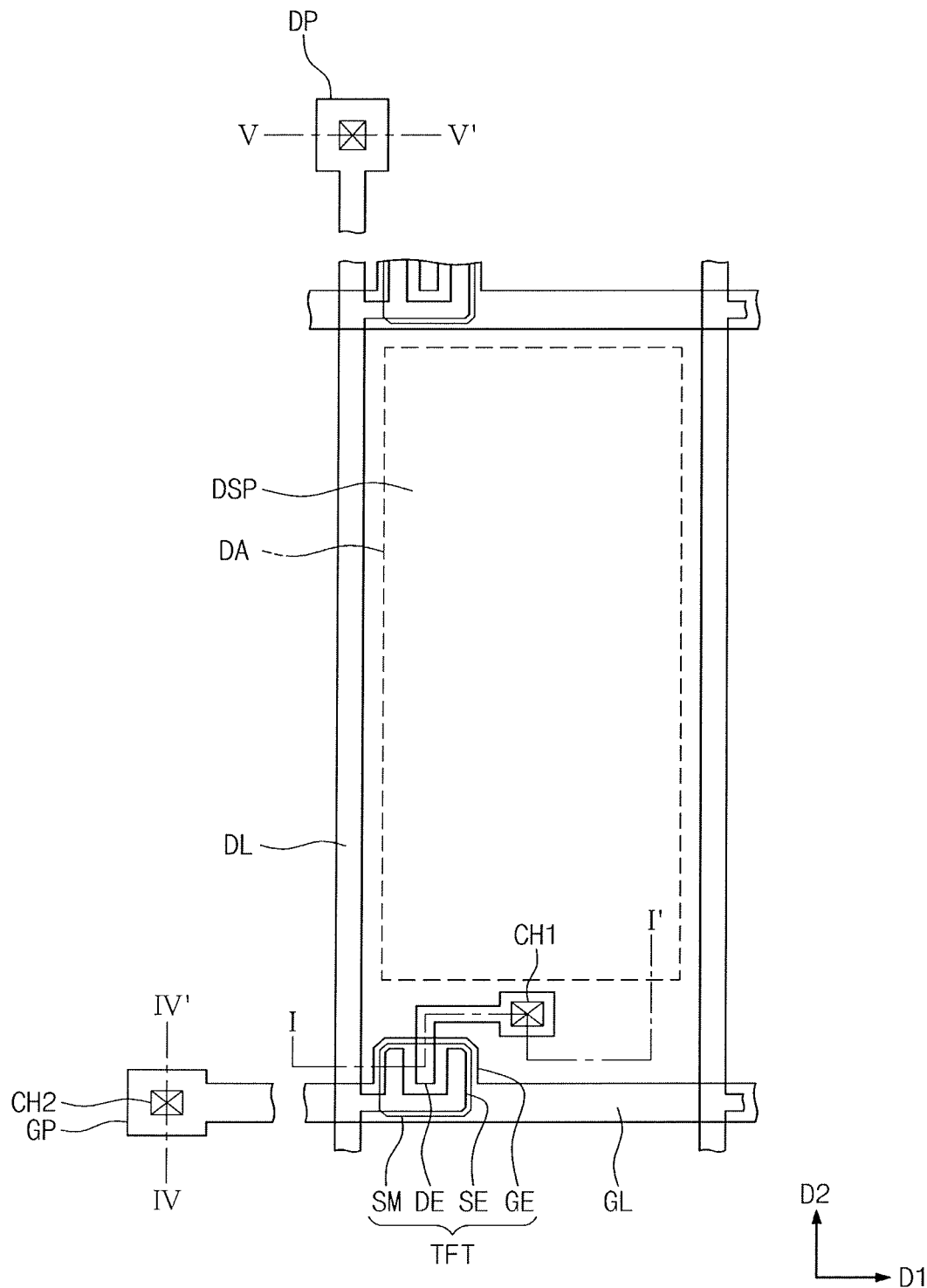
Figure 7B:
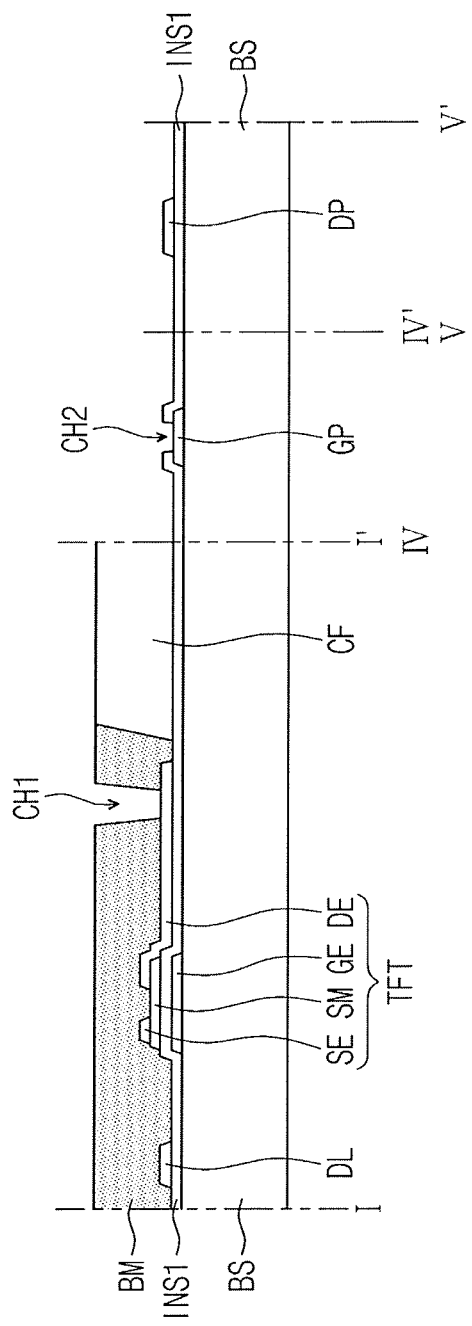

Referring to FIG. 3 and FIGS. 7A and 7B, a color filter part is formed on the base substrate BS on which the data wire is formed (S120), and a first contact hole CH1 exposing a portion of the drain electrode DE and a second contact hole CH2 exposing a portion of the gate pad GP are formed in the color filter part.

The color filter part is formed by forming a color filter CF and a black matrix BM. The color filter CF is formed by forming a color layer which has red, green, blue, or some other colors and then patterning the color layer by using photolithography. However, the method of forming the color filter CF is not limited thereto. Alternatively, for example, an ink-jet scheme is used instead of the photolithography. The black matrix BM is formed by forming a light blocking layer for absorbing light on the base substrate BS and then patterning the light blocking layer using photolithography. The method of forming the black matrix BM is not limited thereto. Alternatively, for example, an ink-jet method is used instead of the photolithography. According to an embodiment, the color filter CF and the black matrix BM are formed in an order different from the order described above. For example, according to an embodiment, the black matrix BM is formed after the red, green, and/or blue color filters CF are formed, or the color filter CF is formed after the black matrix BM is formed. According to an embodiment, the order of forming the red, green, and/or blue color layers varies.

The first contact hole CH1 is formed by patterning the first insulating layer INS1 and a portion of the color filter part on the drain electrode DE using photolithography. The second contact hole CH2 is formed by patterning a portion of the first insulating layer INS1 on the gate pad GP using photolithography.

Alternatively, an additional insulating layer, such as a passivation layer, is disposed between the thin film transistor TFT and the color filter part. The additional insulating layer protects the conductive channel of the thin film transistor TFT and prohibits impurities from diffusing into the thin film transistor TFT.

Figure 8A:
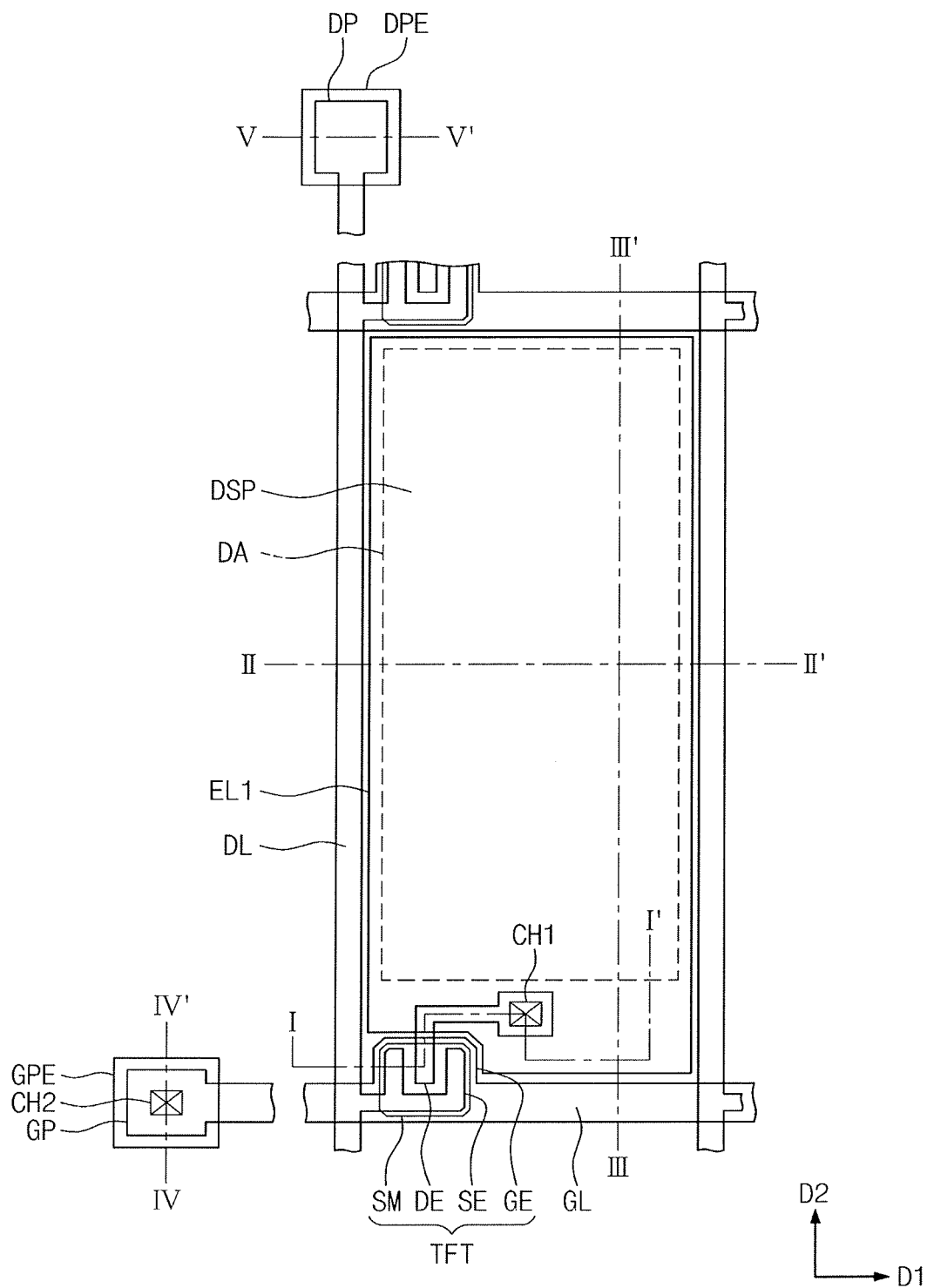

Referring to FIG. 3 and FIGS. 8A and 8B, a first electrode EL1, a gate pad electrode GPE, and a data pad electrode DPE are formed on the color filter part (S130).

The first electrode EL1, the gate pad electrode GPE, and the data pad electrode DPE are formed by forming a conductive layer with a conductive material and then patterning the conductive layer using photolithography. The first electrode EL1 is connected with the drain electrode DE though the first contact hole CH1. The gate pad electrode GPE is connected with the gate pad GP through the second contact hole CH2. The data pad electrode DPE directly contacts the data pad DP.

A second insulating layer INS2 is disposed on the first electrode EL1 to protect the first electrode EL1. According to an embodiment, the second insulating layer INS2 is not disposed on the gate pad electrode GPE and the data pad electrode DPE. Top surfaces of the gate pad electrode GPE and the data pad electrode DPE are exposed and connected with a wire through, for example, an anisotropic conductive film.

Figure 9A:
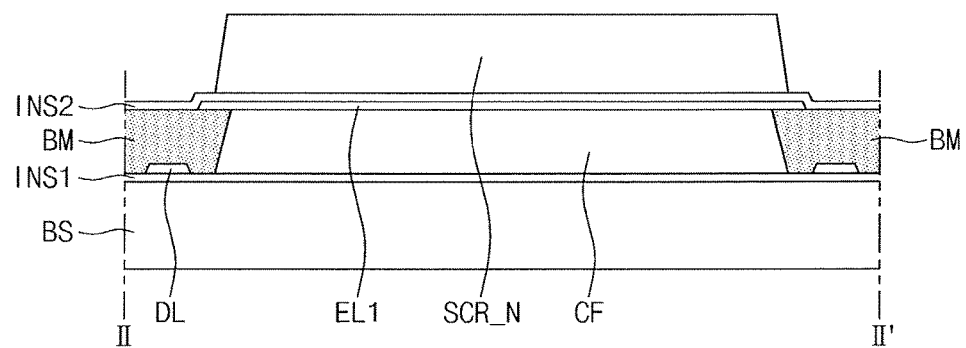
FIGS. 9A, 10A, 11A, 12A, 13A, 14A, and 15A are sectional views taken along the line II-II' of FIG. 8A.
Figure 9B:
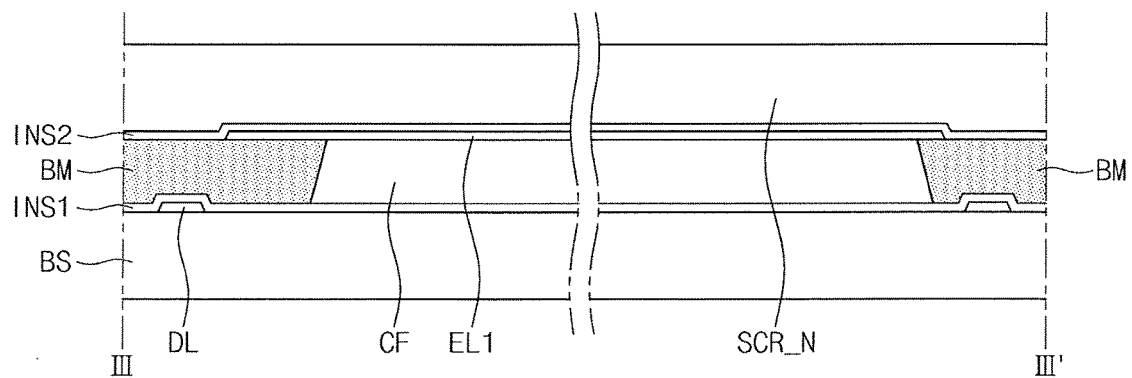
FIGS. 9B, 10B, 11B, 12B, 13B, 14B, and 15B are sectional views taken along the line III-III' of FIG. 8A.

Referring to FIG. 3 and FIGS. 9A and 9B, a sacrificial layer SCR_N is formed on the second insulating layer INS2 (S140).

The sacrificial layer SCR_N covers the display area DA and extends in the second direction D2. When the pixels PX are arranged in the direction D1 which is a row direction and in the direction D2 which is a column direction, the sacrificial layer SCR_N is provided in a shape of a long bar extending in the row direction. However, the extending direction of the sacrificial layer SCR_N is not limited thereto. For example, alternatively, the sacrificial layer SCR_N extends in the first direction D1. The sacrificial layer SCR_N includes an organic polymer, for example, a negative type photo-resist. When the sacrificial layer SCR_N is formed of the negative type photo-resist, the sacrificial layer SCR_N can be easily patterned by photolithography and formed by using an etchant for the negative type photo-resist.

The sacrificial layer SCR_N is provided for forming a TSC (Tunnel Shaped Cavity) after the sacrificial layer SCR_N is removed. The sacrificial layer SCR_N is provided on an area where the TSC is formed. The sacrificial layer SCR_N has a width and height respectively corresponding to a width and height of the TSC.

Figure 10A:
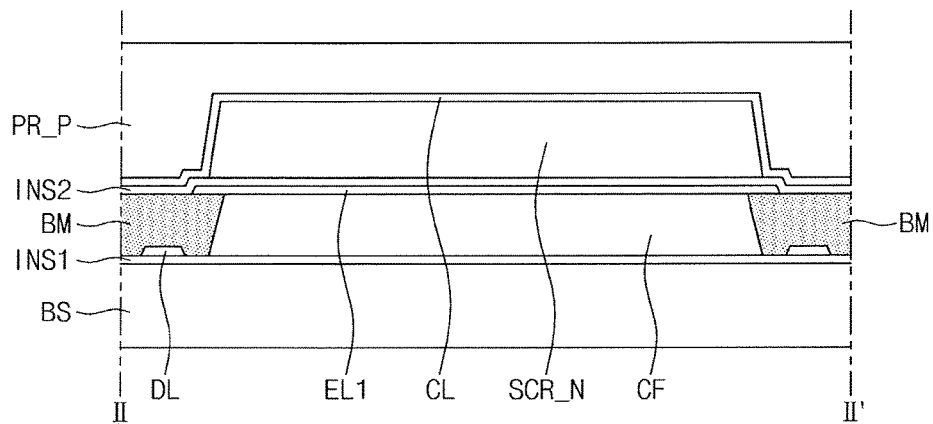
Figure 10B:
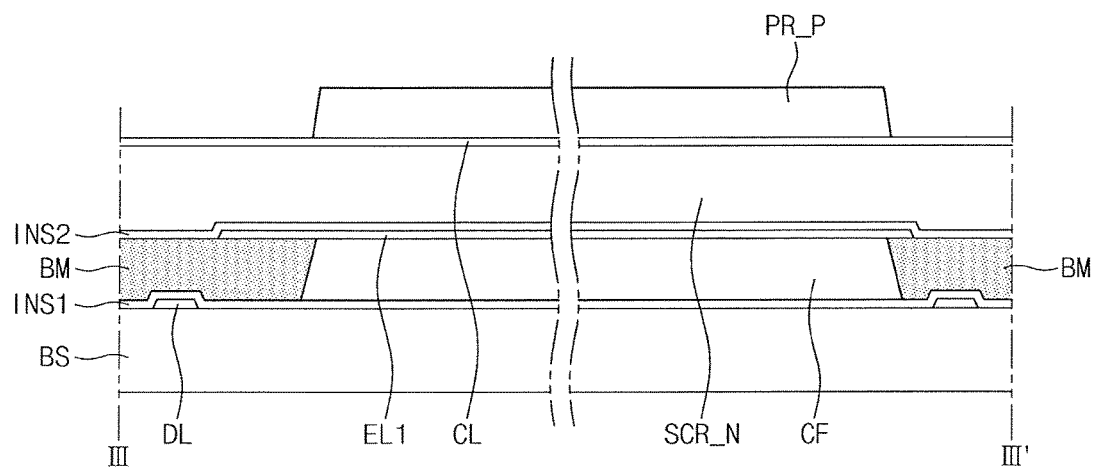

Referring to FIGS. 10A and 10B, a conductive layer CL is formed on the sacrificial layer SCR_N and then a photo-resist pattern PR_P is formed on the conductive layer.

According to an embodiment, the conductive layer CL includes a transparent conductive material, such as indium tin oxide, or indium zinc oxide, and is formed by various schemes, such as physical vapor deposition.

The photo-resist pattern PR_P is formed on an area where a second electrode EL2 is to be formed. According to an embodiment, the photo-resist pattern PR_P is formed by coating a positive-type photo-resist on the conductive layer CL, primarily exposing the photo-resist, and then primarily developing the exposed photo-resist. Since the photo-resist is in the positive type in an embodiment of the present invention, the area of the photo-resist PR_P where the second electrode EL2 is formed is not exposed, and the not-exposed area of the photo-resist PR_P remains after the primary development.

In an embodiment of the present invention, as described above, a negative type photo-resist is employed for the sacrificial layer SCR_N, and a positive type photo-resist for the photo-resist pattern PR_P. When a photo-resist for the sacrificial layer SCR_N and a photo-resist for the conductive layer CL have the same or substantially the same type, the photo-resists for the sacrificial layer SCR_N and the conductive layer CL may be removed during the primary exposure and the primary development of the photo-resist for the conductive layer CL. Thus, the photo-resist for the sacrificial layer SCR_N and the photo-resist for the conductive layer CL have different types from each other in an embodiment of the present invention. As a consequence, the sacrificial layer SCR_N is not harmed by the exposure and the development of the photo-resist for the conductive layer CL.

Figure 11A:
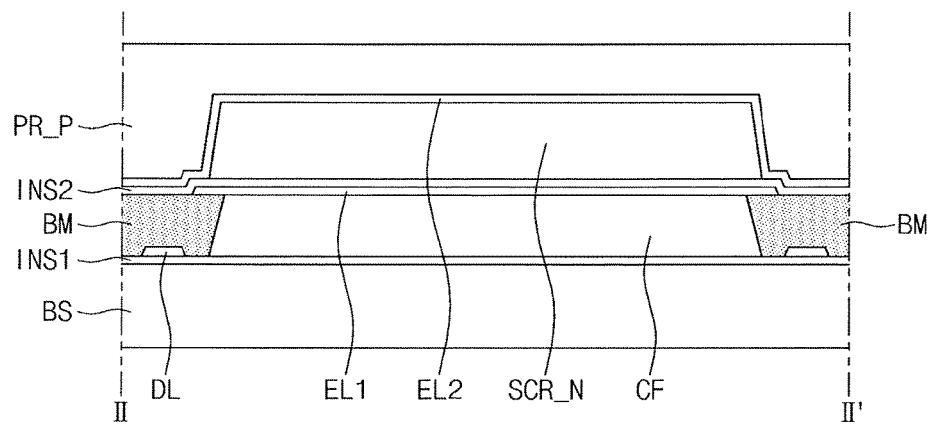
Figure 11B:
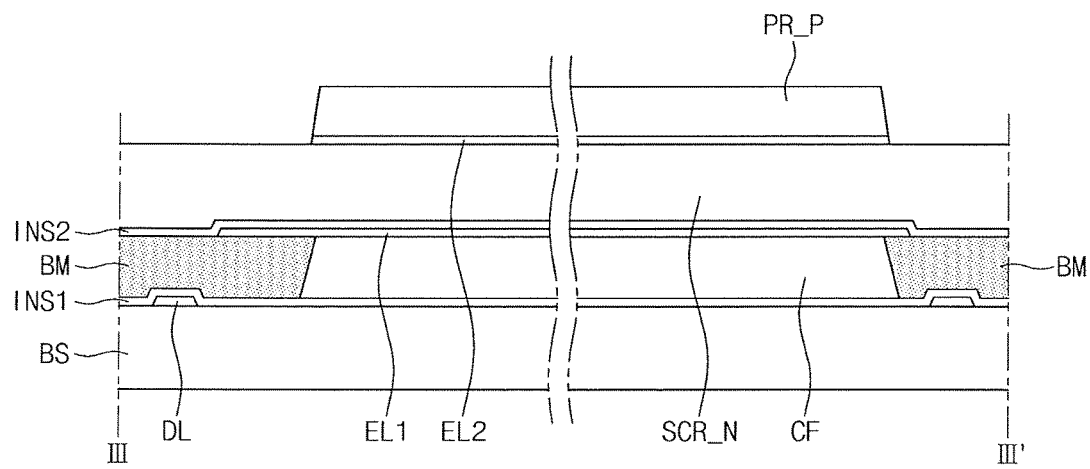

Referring to FIG. 3 and FIGS. 11A and 11B, the second electrode EL2 is formed on the sacrificial layer SCR_N (S150). The second electrode EL2 may be formed by etching the conductive layer CL using the photo-resist pattern PR_P as a mask.

Figure 12A:
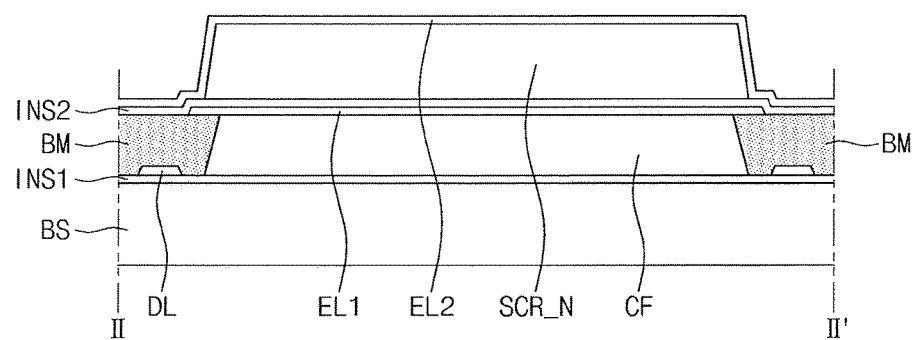
Figure 12B:
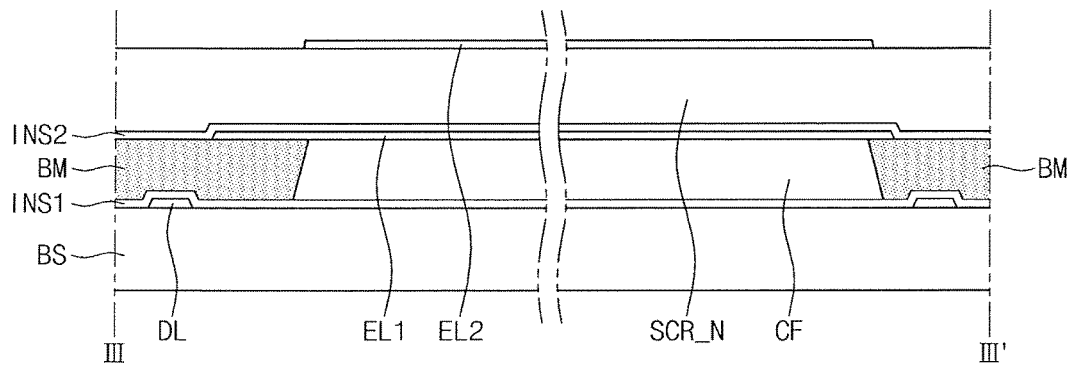

Referring to FIGS. 12A and 12B, the photo-resist pattern PR_P is removed by secondarily exposing and secondarily developing the photo-resist pattern PR_P. The sacrificial layer SCR_N is hard-baked or cured when the secondary exposure is carried out, and remains after the secondary development since the sacrificial layer SCR_N is formed in the opposite (negative) type of the photo-resist pattern PR_P. As a result, the second electrode EL2 can be formed through a single process using one mask without influencing other elements.

Figure 13A:
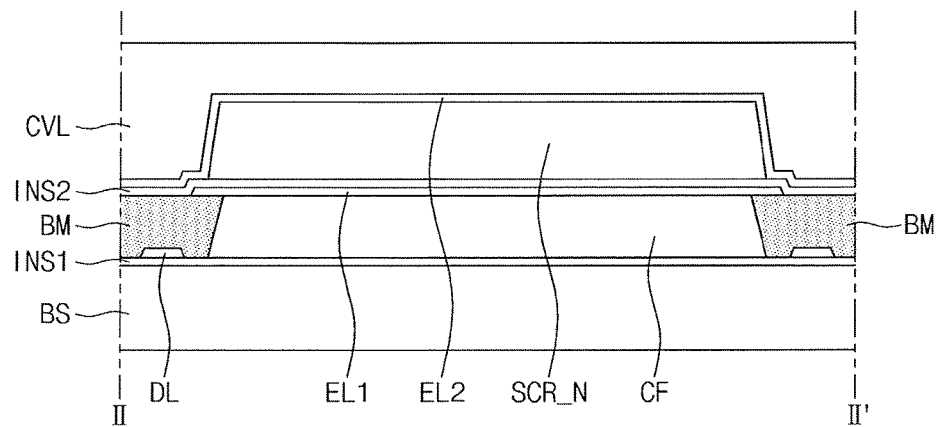
Figure 13B:
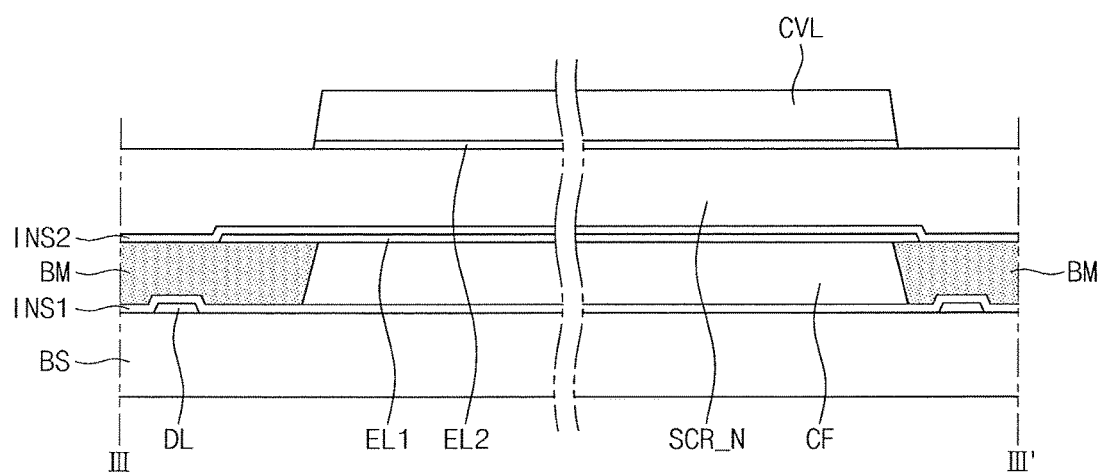

Referring to FIG. 3 and FIGS. 13A and 13B, a cover layer CVL is formed on the base substrate BS where the second electrode EL2 is formed (S160). The cover layer CVL extends in the first direction D1 and covers the second electrode EL2. According to an embodiment, the cover layer CVL may be formed to a thickness of about 10 μm to about 100 μm. The cover layer CVL is soft baked to minimize the influence from an etchant during removing the sacrificial layer SCR_N.

The second electrode EL2 and the cover layer CVL overlap each other in a plan view and have the same or substantially the same shape as each other. However, alternatively, the cover layer CVL has an area larger than an area of the second electrode EL2 to completely cover the second electrode EL2 considering a design margin. For example, according to an embodiment, the cover layer CVL is formed with an area increased 10% than an originally designed area in a plan view to overlap the black matrix BM corresponding to an area where the thin film transistor is formed. The cover layer CVL is not formed at two sides of the display area DA in the second direction D2. As a consequence, a top surface of the sacrificial layer SCR_N corresponding to the two sides of the display area DA in the second direction D2 is exposed to an exterior.

Figure 14A:
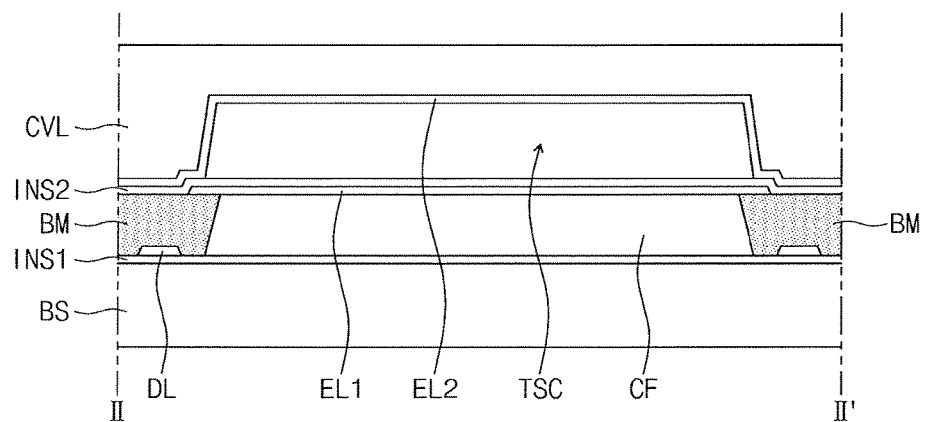
Figure 14B:
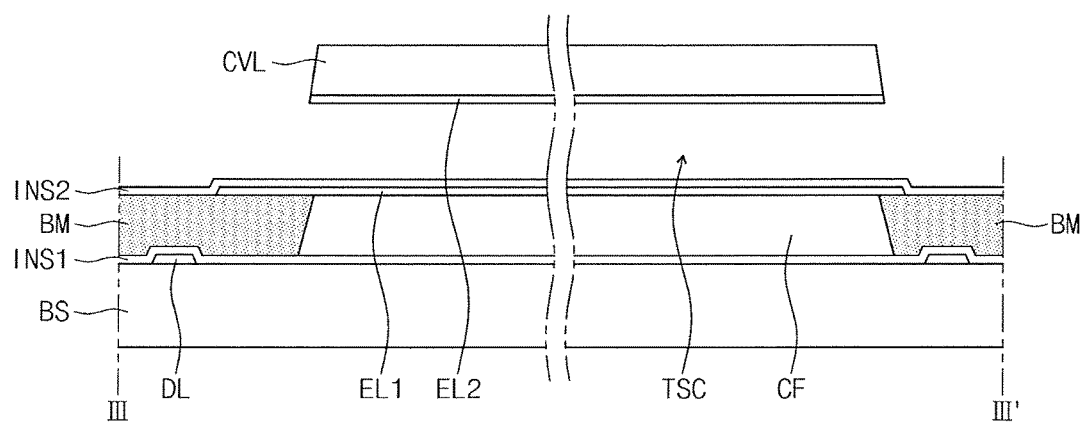

Referring to FIG. 3 and FIGS. 14A and 14B, the sacrificial layer SCR_N is removed by a wet-etching process to form a TSC (S170). The sacrificial layer SCR_N is sequentially etched from the exposed top surface of the sacrificial layer SCR_N to an interior of the sacrificial layer SCR_N through the wet etching process. As a consequence, the top surface of the second insulating layer INS2 and the bottom surface of the second electrode EL2 corresponding to the display area DA are exposed, resulting in forming the TSC defined by the top surface of the second insulating layer INS2, the bottom surface of the second electrode EL2, and the two sides in the display area DA in the second direction D2. The wet etching process is performed for removing the sacrificial layer SCR_N and uses various etchants according to materials of the sacrificial layer SCR_N. According to an embodiment, when the sacrificial layer SCR_N is formed of a negative type photo-resist, a solution for stripping the negative type photo-resist is employed.

In an embodiment of the present invention, an inorganic insulating layer is formed on the sacrificial layer SCR_N before forming the second electrode EL2. According to an embodiment, an additional inorganic insulating layer is also formed on the second electrode EL2 before forming the cover layer CVL. The inorganic insulating layer and the additional inorganic insulating layer support the cover layer CVL and stably maintain the TSC when etching the sacrificial layer SCR_N.

Figure 15A:
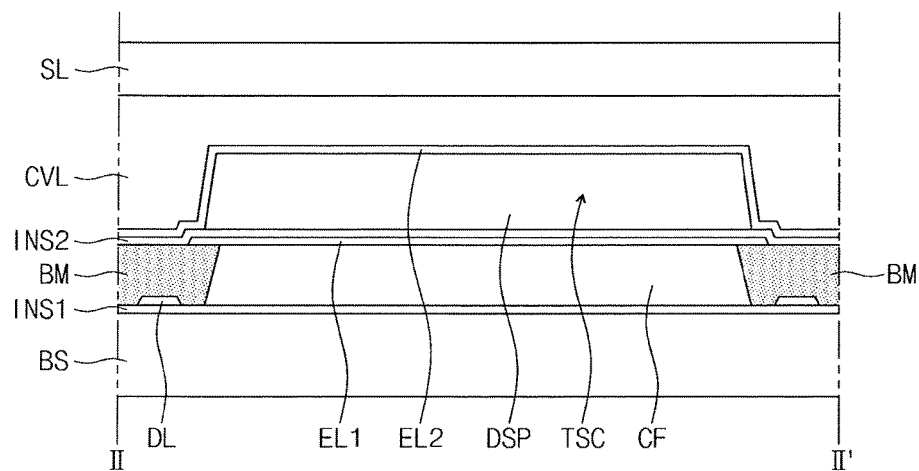
Figure 15B:
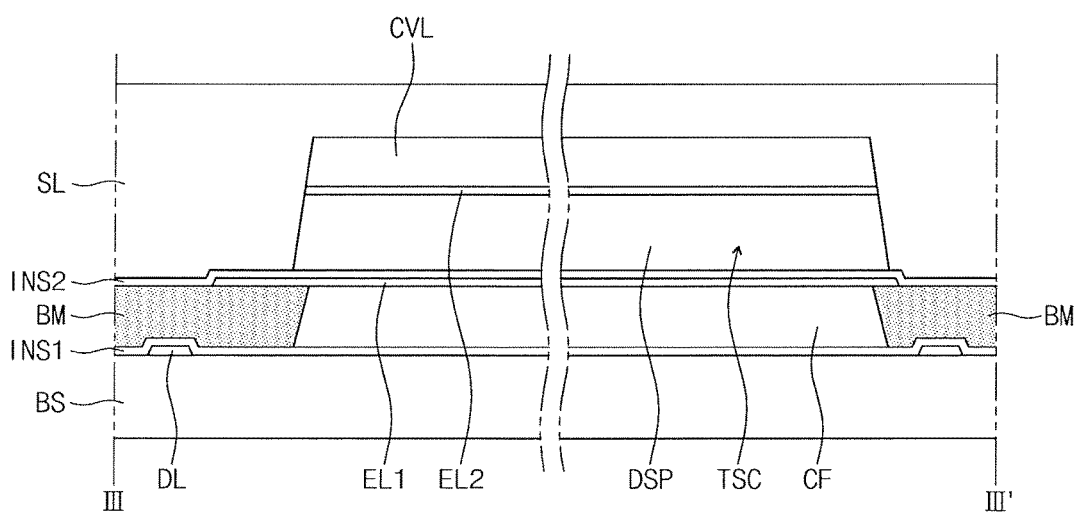

Referring to FIG. 3 and FIGS. 15A and 15B, an image display part DSP, such as a liquid crystal layer having liquid crystal, is formed in the TSC (S180). Since the liquid crystal is provided in the form of a fluid, the liquid crystal may migrate into the TSC when the liquid crystal is supplied to a place adjacent to the TSC due to the capillary phenomenon. The liquid crystal can be supplied to a place adjacent to the TSC through an inkjet scheme by using a micropipette, or supplied into the TSC by using a vacuum injection device. When the liquid crystal is supplied into the TSC by using the vacuum injection device, a part of the base substrate BS having the TSC is immersed in a container filled with liquid crystal and provided in a chamber, and the pressure of the chamber is lowered, so that the liquid crystal is supplied into the TSC due to the capillary phenomenon.

In an embodiment of the present invention, the alignment layer (not shown) is formed in the TSC where the sacrificial layer SCR_N has been removed. According to an embodiment, the alignment layer is formed using an alignment solution before the image display part DSP is formed. The alignment solution contains an alignment material, such as polyimide, mixed with a predetermined solvent. The alignment solution includes a liquid-phase alignment material. The liquid-phase alignment material may migrate into the TSC when the liquid-phase alignment material is supplied to a place adjacent to the TSC due to the capillary action. The alignment solution can be supplied in the vicinity of the TSC through an inkjet scheme by using a micropipette or supplied into the TSC by using a vacuum injection device. Then, the solvent is removed. To remove the solvent, the base substrate BS is subject to a room temperature or heat.

According to an embodiment, the alignment layer is omitted depending on the type of the liquid crystal or the structure of the first and second electrodes EL1 and EL2. For instance, according to an embodiment, when the first and second electrodes EL1 and EL2 are patterned in a predetermined shape so that any alignment operation is unnecessary, the alignment layer can be omitted. According to an embodiment, when the liquid crystal layer includes a reactive mesogen layer for the alignment, the alignment layer can be omitted.

Next, the liquid crystal is removed from an area except the TSC, and a sealing layer SL is formed to seal the TSC (S190). The sealing layer seals an opening of the TSC through which the liquid crystal is injected according to the capillary action.

The sealing layer SL is formed by using a soft-baked (or semi-cured, or half-baked) polymer material. The polymer material has a predetermined fluidity before the polymer material is completely cured. To form the sealing layer SL, the polymer material is formed in a plate-shape having a predetermined thickness such that the polymer material can cover the base substrate BS. Then, the plate-shape polymer material is placed on the base substrate BS and pressure is applied onto the plate-shape polymer material. Since the polymer material has fluidity, the polymer material can be provided in the recess formed in the base substrate BS. The polymer material contacts the top surface of the cover layer CVL, the sides of the image display part DSP, and the top surface of the second insulating layer INS2, so that the image display material, such as liquid crystal, is entrapped in the TSC. The semi-cured polymer material is hard-baked later and cured.

According to an embodiment, after the sealing layer SL has been formed, the first and second polarizers are attached respectively on the bottom surface of the base substrate BS and on the top surface of the sealing layer SL. The polarizers are provided to polarize light passing through the liquid crystal layer. A transmission axis of the first polarizer is perpendicular or substantially perpendicular to a transmission axis of the second polarizer. According to an embodiment, the first and second polarizes each include an adhesive.

Figure 16:
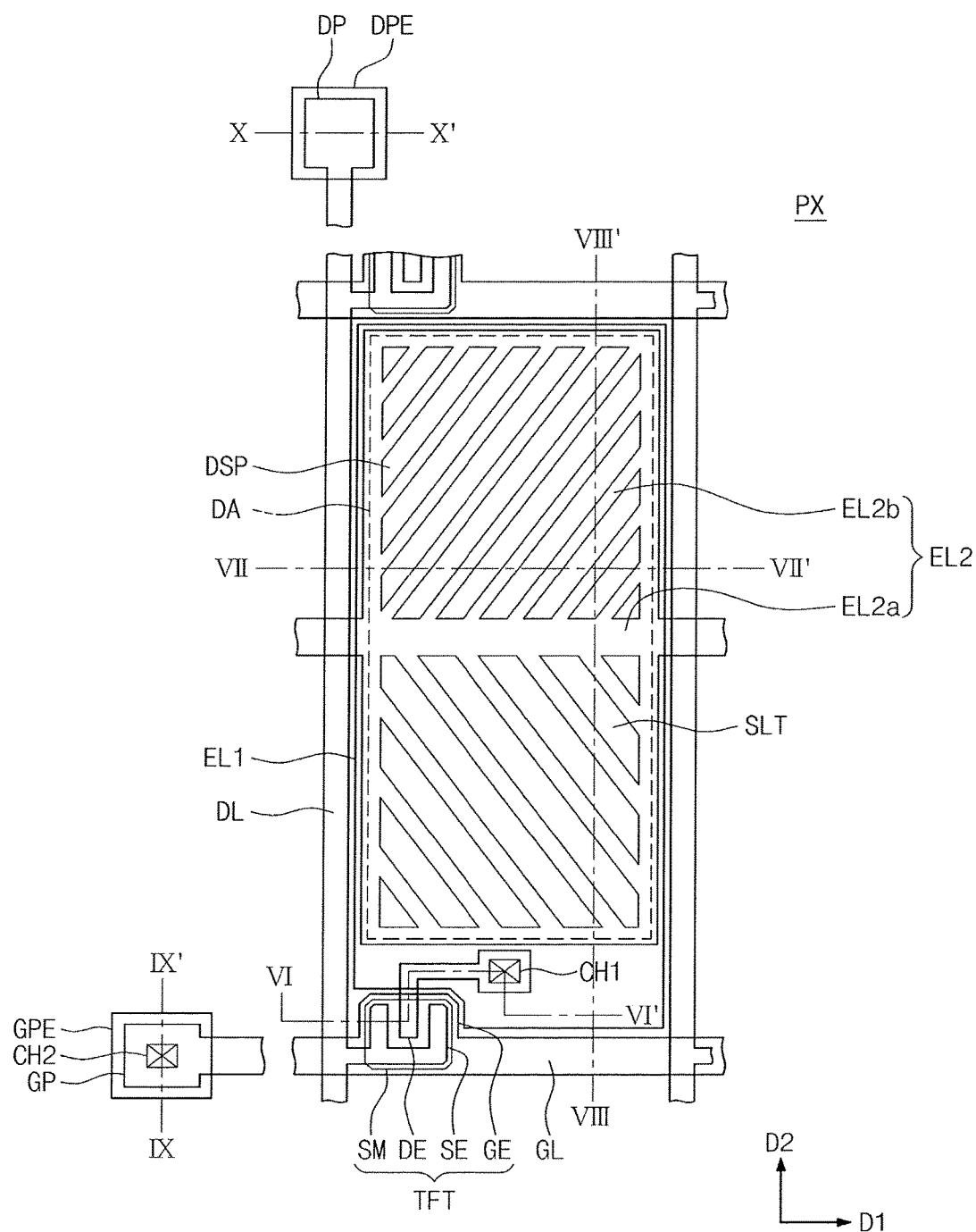
FIG. 16 is a plan view showing a display apparatus according to an embodiment of the present invention.

FIG. 16 is a plan view showing a display apparatus according to an embodiment of the present invention. In an embodiment, a liquid crystal layer is employed as the image display part DSP, and the first and second electrodes EL1 and EL2 are disposed under the TSC.

Figure 17A:
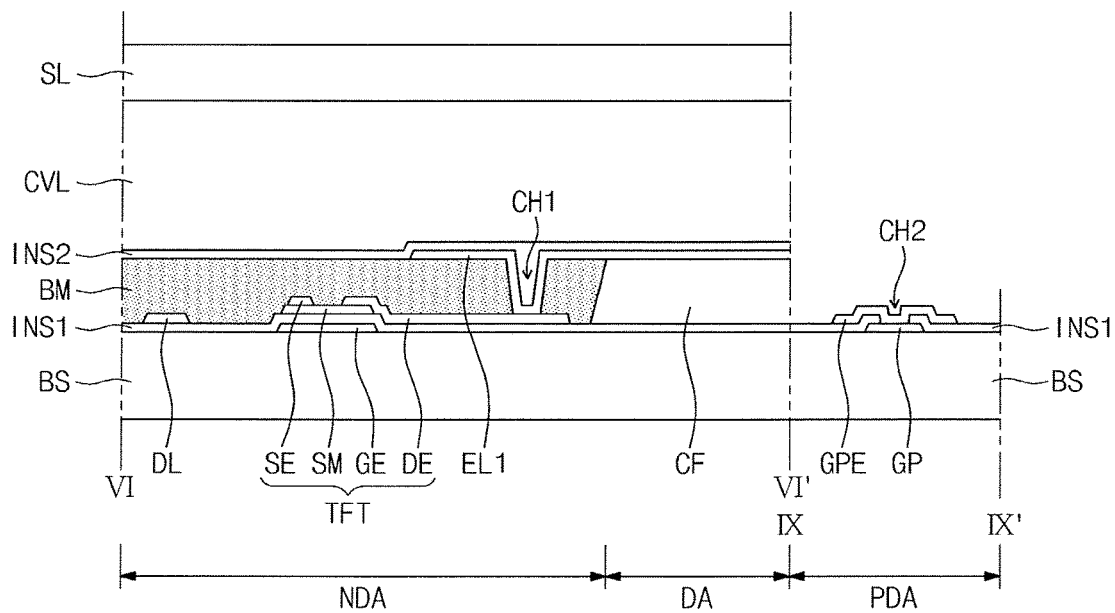
FIG. 17A is a sectional view taken along lines VI-VI' and IX-IX' of FIG. 16.
Figure 17B:
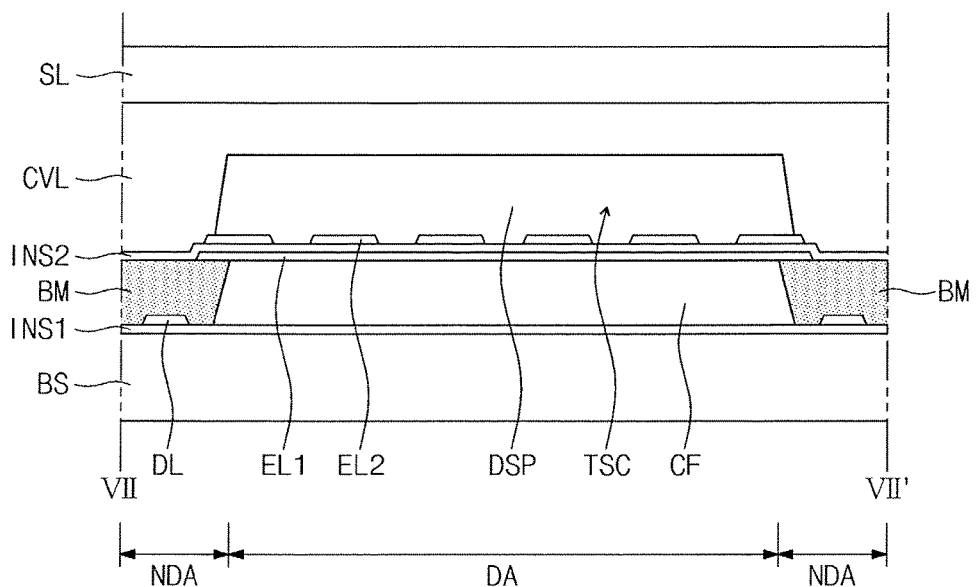
FIG. 17B is a sectional view taken along line VII-VII' of FIG. 16.
Figure 17C:
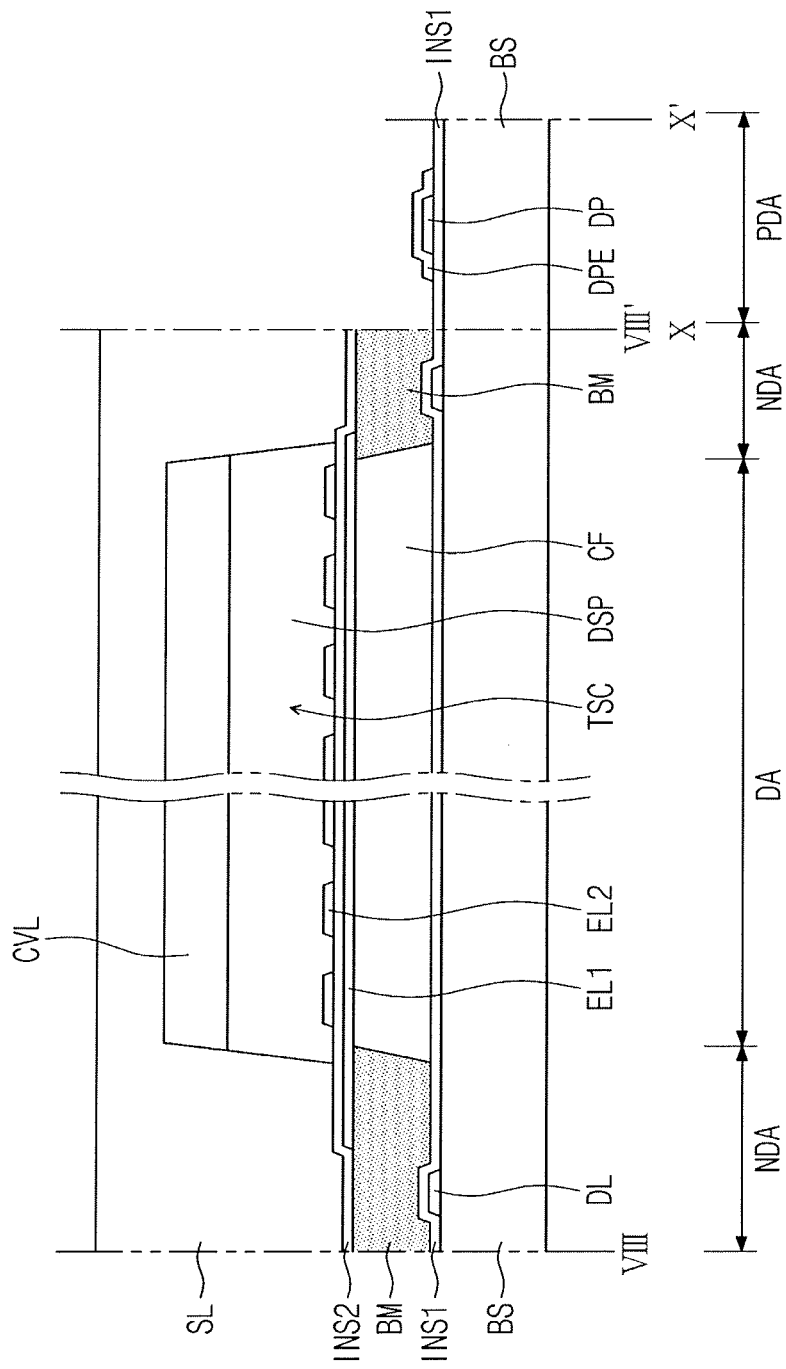
FIG. 17C is a sectional view taken along lines VIII-VIII' and X-X' of FIG. 16.

FIG. 17A is a sectional view taken along lines VI-VI' and IX-IX' of FIG. 16. FIG. 17B is a sectional view taken along line VII-VII' of FIG. 16. FIG. 17C is a sectional view taken along lines VIII-VIII' and X-X' of FIG. 16. Although only one pixel PX is shown in FIGS. 16, 17A, 17B and 17C, for purposes of description, according to an embodiment of the present invention, the display apparatus includes a plurality of pixels PX. The pixels PX are arranged in the form of a matrix having a plurality of columns and a plurality of rows. According to an embodiment, the pixels have the same structure. Only one pixel PX will be described below for purposes of description. Although the pixel PX has a rectangular shape extending in one direction, the embodiments of the present invention are not limited thereto. According to an embodiment, the pixel PX has various shapes, such as a V shape or a Z shape.

Referring to FIGS. 1A, 16, 17A, 17B, and 17C, a display apparatus according to an embodiment of the present invention includes a base substrate BS, a color filter part and a pixel PX on the base substrate BS.

The base substrate BS is a transparent or opaque insulating base substrate and according to an embodiment, includes silicon, glass, or plastic. The base substrate BS includes a pixel area PA in which the pixels PX are arranged and a pad area PDA which is provided on at least one side of the pixel area PA. The pixel area PA includes a display area DA corresponding to a pixel PX and displaying an image, and a non-display area NDA which is provided on at least one side of the display area DA.

A wiring part through which signals are transferred and a thin film transistor TFT operating the pixel PX are provided on the base substrate BS between the base substrate BS and the pixel PX. The wiring part and the thin film transistor TFT are provided on the non-display area NDA. The wiring part includes a gate line GL and a data line DL which are provided on the non-display area NDA. The gate line GL and the data line DL cross each other with a first insulating layer INS1 disposed between the gate line GL and the data line DL. The thin film transistor TFT is connected with the gate line GL and the data line DL and includes a gate electrode GE, a semiconductor layer SM, a source electrode SE, and a drain electrode DE.

A color filter part is provided on the thin film transistor TFT. The color filter part includes a color filter CF and a black matrix BM.

The pixel PX is provided on the base substrate BS, for example, on the color filter part. The pixel PX includes a cover layer CVL to define a TSC on the base substrate BS, an image display part DSP in the TSC, and first and second electrodes EL1 and EL2 to control the image display part DSP.

The first electrode EL1 is provided on the color filter part. The first electrode EL1 is provided on an area corresponding to where the display area DA is located. The first electrode EL1 is connected with the thin film transistor TFT through a first contact hole CH1 of the color filter part. The first electrode EL1 has a plate-shape.

A second insulating layer INS2 is disposed on the first electrode EL1 and protects the first electrode EL1.

The second electrode EL2 is provided on the second insulating layer INS2. The second electrode EL2 overlaps the first electrode EL1 in a plan view. Part of the second electrode EL2 is removed to form a plurality of slits SLT. According to an embodiment, the slits SLT are inclined to the first direction D1 or the second direction D2. According to an embodiment, the second electrode EL2 includes a plurality of areas in which the slits SLT are inclined in different directions from each other. According to an embodiment, the areas are substantially axisymmetrical with each other with respect to an imaginary line crossing the pixel or substantially point-symmetrical with each other with respect to a position of the pixel. As an example, FIG. 16 shows that the slits SLT are substantially axisymmetrical with each other with respect to an imaginary line crossing the pixel PX along the first direction D1.

According to an embodiment, the second electrode EL2 includes a trunk portion EL2a formed in each pixel and a plurality of branches EL2b provided from the trunk portion EL2a and divided by the slits SLT. The branches EL2b are spaced apart from each other at a predetermined interval. The branches EL2b of the second electrode EL2 generate a fringe electric field together with the first electrode EL1. The branches EL2b extend in a predetermined direction to be substantially parallel to each other. According to an embodiment, the trunk portion EL2a and the branches EL2b have various shapes. For instance, according to an embodiment, the branches EL2b are inclined in a direction in which the trunk portion EL2a is extended and in a direction perpendicular or substantially perpendicular to the extension direction of the trunk portion EL2a. According to an embodiment, the trunk portion EL2a is bent several times. The second electrodes EL2 provided on the pixels PX adjacent to each other are connected with each other.

Alternatively, although not shown in the drawings, the first electrode EL1 includes a first trunk portion and a plurality of first branches extended from the first trunk portion, and the second electrode EL2 includes a second trunk portion and a plurality of second branches extended from the second trunk portion. The first branches are spaced apart from each other at a predetermined interval, and the second branches are also spaced apart from each other at a predetermined interval. According to an embodiment, the first branches and the second branches are alternately arranged in a plan view, so that the first and second branches generate an in-plane field.

A cover layer CVL is disposed on the second electrode EL2 and extends in the first direction D1. The cover layer CVL, a portion of which is spaced apart from the top surface of the second electrode EL2 and the top surface of the second insulating layer INS2, defines the TSC together with the second electrode EL2 and the second insulating layer INS2. For example, the cover layer CVL is spaced apart from the second electrode EL2 and the second insulating layer INS2 in an upper direction in the display area DA and provides a space or cavity. The cover layer CVL does not form any space between the cover layer CVL, and the second electrode EL2 and the second insulating layer INS2 along the second direction D2 in the non-display area NDA. As a consequence, the TSC has a shape extending in the second direction D2, and two ends of the TSC, e.g., one end of the TSC in the second direction D2 and the other end of TSC in an opposite direction of the second direction D2, are opened since the cover layer CVL is not formed. However, the extending direction of the cover layer CVL is not limited thereto, and according to an embodiment, the cover layer CVL extends in a different direction from the first direction D1.

The image display part DSP is formed in the TSC. In an embodiment of the present invention, the image display part DSP is provided between the first and second electrodes EL1 and EL2 and the cover layer CVL. The image display part DSP is controlled by the fringe field generated by the first and second electrodes EL1 and EL2, resulting in displaying an image. The image display part is not limited to a specific type as long as the image display part can be controlled by an electric field and includes a fluid.

According to an embodiment, an inorganic insulating layer is disposed between the image display part DSP and the cover layer CVL. The inorganic insulating layer includes an insulating material, such as silicon nitride or silicon oxide. The inorganic insulating layer supports the cover layer CVL so that the cover layer CVL stabilizes the TSC.

A sealing layer SL is disposed on the cover layer CVL. The sealing layer SL covers substantially an entire surface of the base substrate BS. The sealing layer seals the openings of two ends of the TSC and seals the TSC. The TSC is sealed by the second insulating layer INS2, the second electrode EL2, the cover layer CVL, and the sealing layer SL.

The wiring part further includes a gate pad part GPP and a data pad part DPP provided on the pad area PDA.

Figure 18:
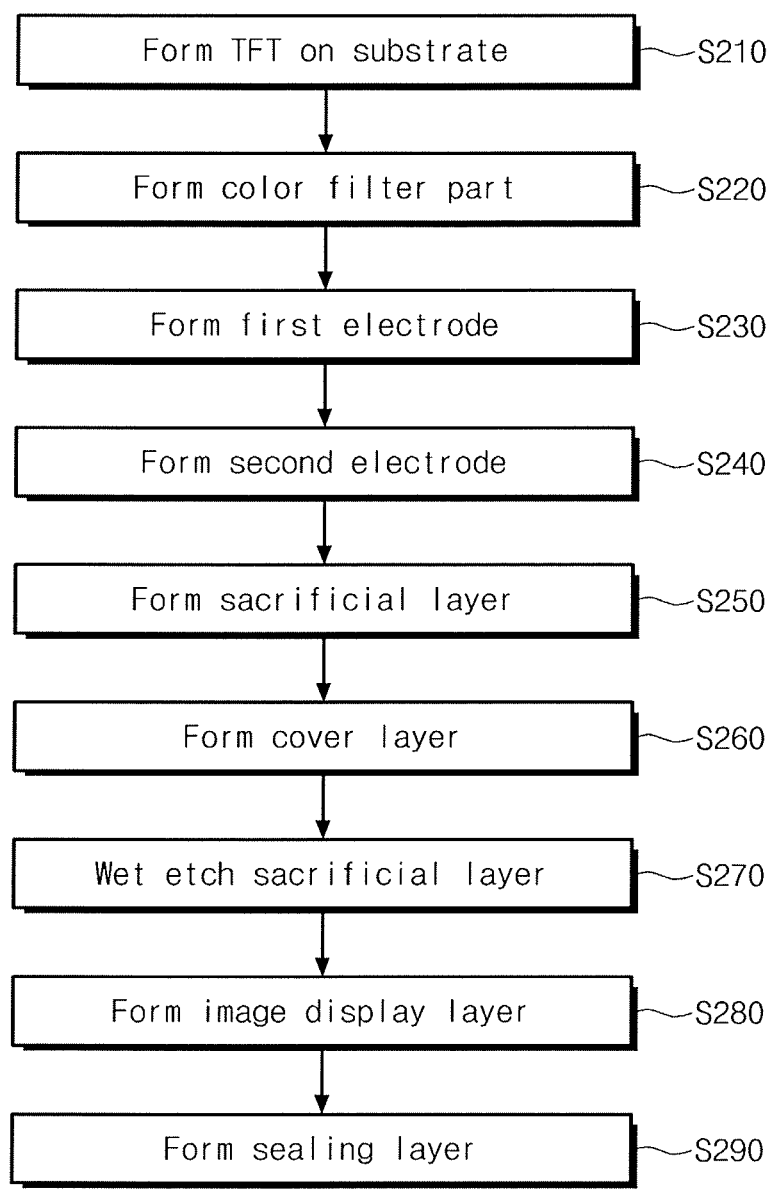
FIG. 18 is a flowchart showing a method of manufacturing a display apparatus according to an embodiment of the present invention.

FIG. 18 is a flowchart showing a method of manufacturing a display apparatus as shown in FIGS. 16, 17A to 17C according to an embodiment of the present invention. FIGS. 19A, 20A, 21A, and 22A are sectional views taken along line VII-VII' of FIG. 16. FIGS. 19B, 20B, 21B, and 22B are sectional views taken along line VIII-VIII' of FIG. 16.

Referring to FIG. 18, a thin film transistor TFT and a color filter part are formed on a base substrate BS (S210, S220). Next, a first electrode EL1, a second electrode EL2, a sacrificial layer SCR_P, and a cover layer CVL are sequentially formed on the color filter part (S230, S240, S250, S260) and then the sacrificial layer SCR_P is removed (S270). After an image display part DSP is formed (S280), a sealing layer SL is formed to seal the image display part DSP (S290).

The steps S210, S220, and S230 of forming the thin film transistor TFT, the color filter part, and the first electrode EL1 are the same or substantially same as the steps S110, S120, and S130 described in connection with FIG. 3.

Figure 19A:
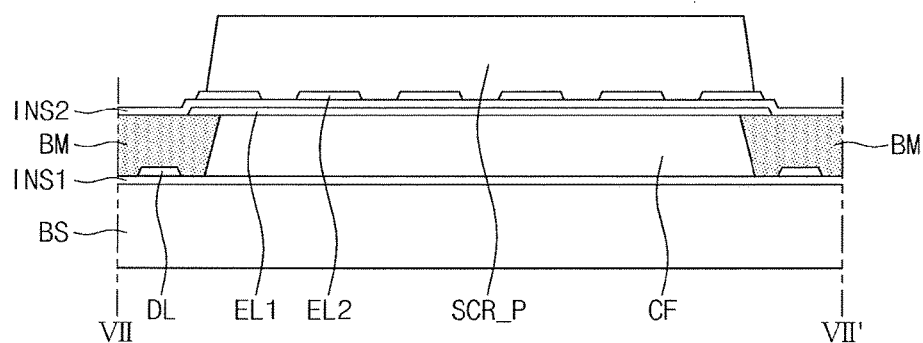
FIGS. 19A, 20A, 21A, and 22A are sectional views taken along line VII-VII' of FIG. 16.
Figure 19B:
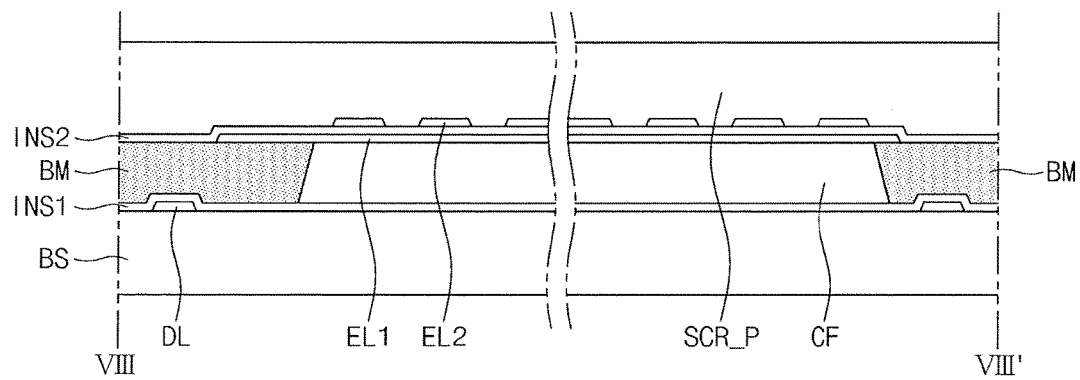
FIGS. 19B, 20B, 21B, and 22B are sectional views taken along line VIII-VIII' of FIG. 16.

Referring to FIG. 18 and FIG. 19A and 19B, the second electrode EL2 is formed on the base substrate BS where the second insulating layer INS2 is formed (S240), and then the sacrificial layer SCR_P is formed on the second electrode EL2 (S250).

The second electrode E2 is formed by forming a conductive layer on the second insulating layer INS2 and then patterning the conductive layer using photolithography.

The sacrificial layer SCR_P covers the display area DA and extends in the second direction D2. The sacrificial layer SCR_P includes an organic polymer. The sacrificial layer SCR_P is formed by performing patterning by photolithography. According to an embodiment, the sacrificial layer SCR_P is formed of a positive type photo-resist. The sacrificial layer SCR_P is removed, resulting in forming a TSC (Tunnel Shaped Cavity). The sacrificial layer SCR_P is provided on an area where the TSC is to be formed and has a width and height the same or substantially the same as a width and height of the TSC.

Figure 20A:
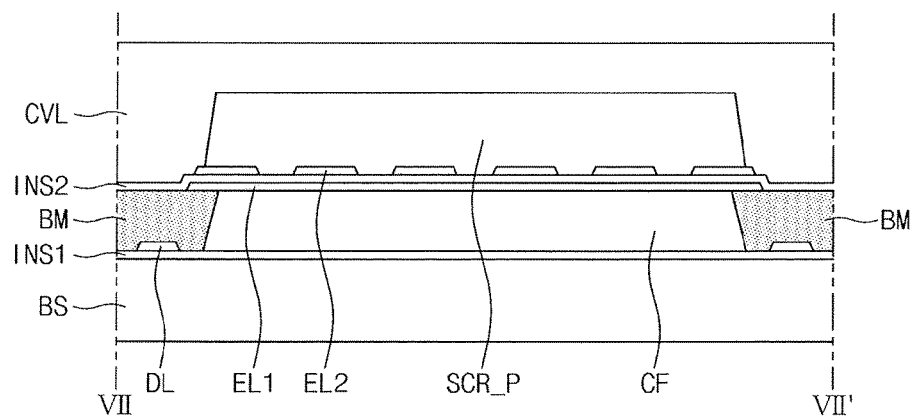
Figure 20B:
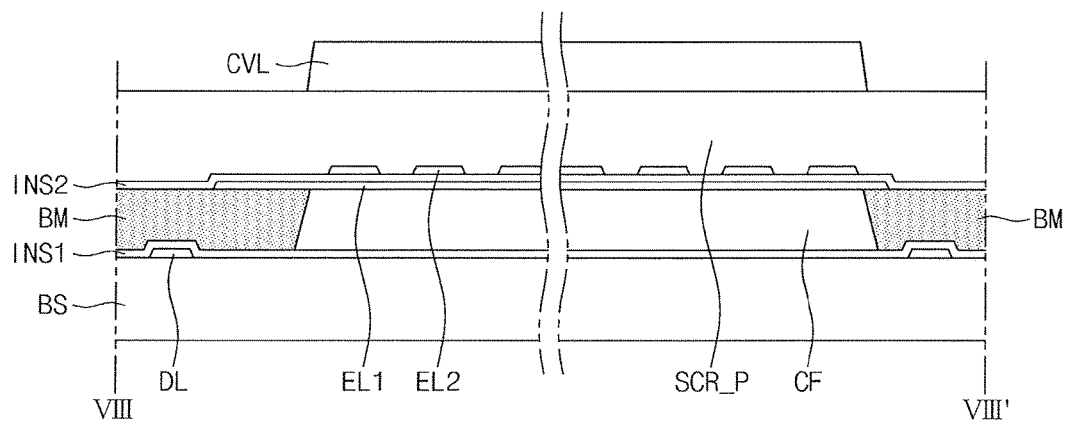

Referring to FIG. 18 and FIGS. 20A and 20B, a cover layer CVL is formed on the sacrificial layer SCR_P (S260). The cover layer CVL includes a photo-resist which is of an opposite type to the sacrificial layer SCR_P. For example, the cover layer CVL includes a negative type photo-resist. The cover layer CVL is not damaged during the step of removing the sacrificial layer SCR_P since the sacrificial layer SCR_P is removed but the cover layer CVL remains when the sacrificial layer SCR_P and the cover layer CVL are exposed to a strip solution.

The cover layer CVL extends in the first direction D1 and covers a portion of the sacrificial layer SCR_P. According to an embodiment, the cover layer CVL has a thickness of about 0.1 μm to about 100 μm. The cover layer CVL is not formed at two sides of the display area DA in the second direction D2. As a consequence, a portion of the top surface of the sacrificial layer SCR_P corresponding to the two sides of the display area DA in the second direction D2, e.g., a portion of the sacrificial layer SCR_P which corresponds to the non-display area NDA, is exposed to an exterior.

Figure 21A:
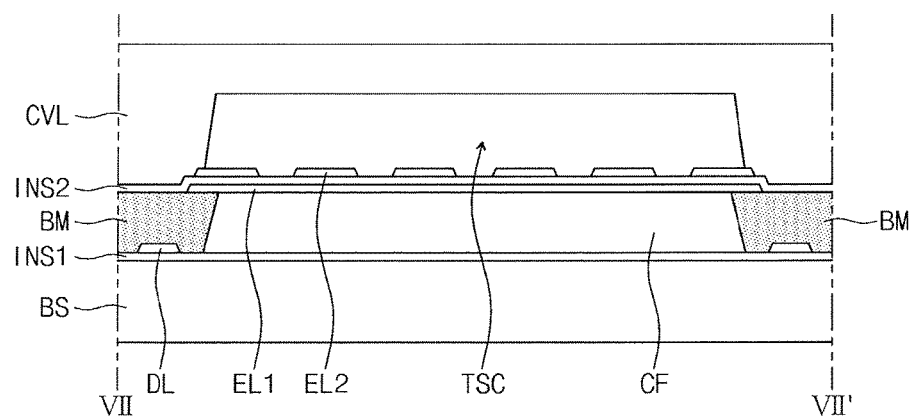
Figure 21B:
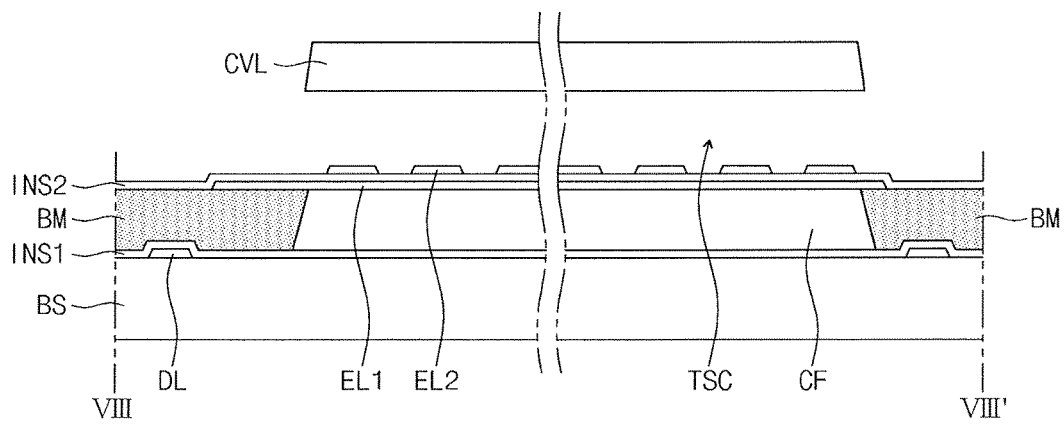

Referring to FIG. 18 and FIGS. 21A and 21B, the sacrificial layer SCR_P is removed by a wet etching process to form a TSC (S270). The sacrificial layer SCR_P is sequentially etched from the exposed top surface of the sacrificial layer SCR_P to the interior of the sacrificial layer SCR_P through the wet etching process. As a consequence, the top surface of the second insulating layer INS2, the top surface of the second electrode EL2, and the bottom surface of the cover layer CVL corresponding to the display area DA are exposed, resulting in forming the TSC defined by the top surfaces of the second insulating layer INS2 and the second electrode EL2, the bottom surface of the cover layer CVL, and the lateral surfaces of the cover layer corresponding to the two sides of the display area DA in the second direction D2. The wet etching process is performed for removing the sacrificial layer SCR_P. The wet etching process uses various etchants according to materials of the sacrificial layer SCR_P. According to an embodiment, when the sacrificial layer SCR_P is formed of a negative type photo-resist, a solution for stripping the negative type photo-resist is employed.

Figure 22A:
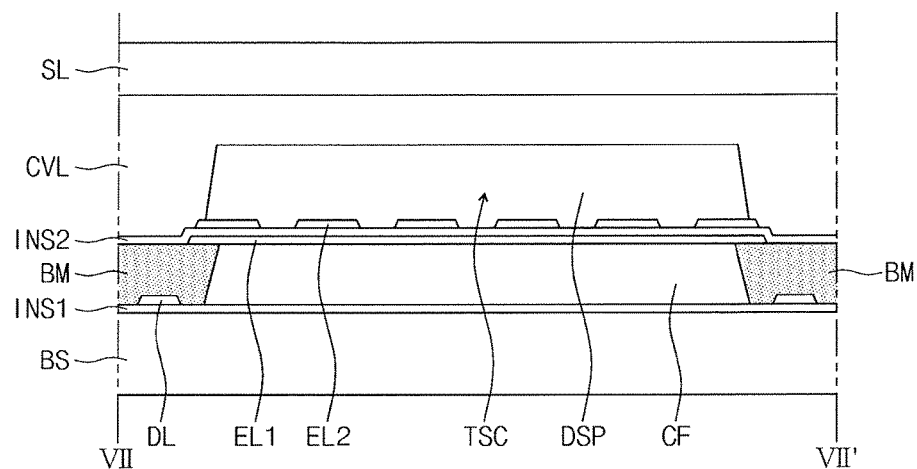
Figure 22B:
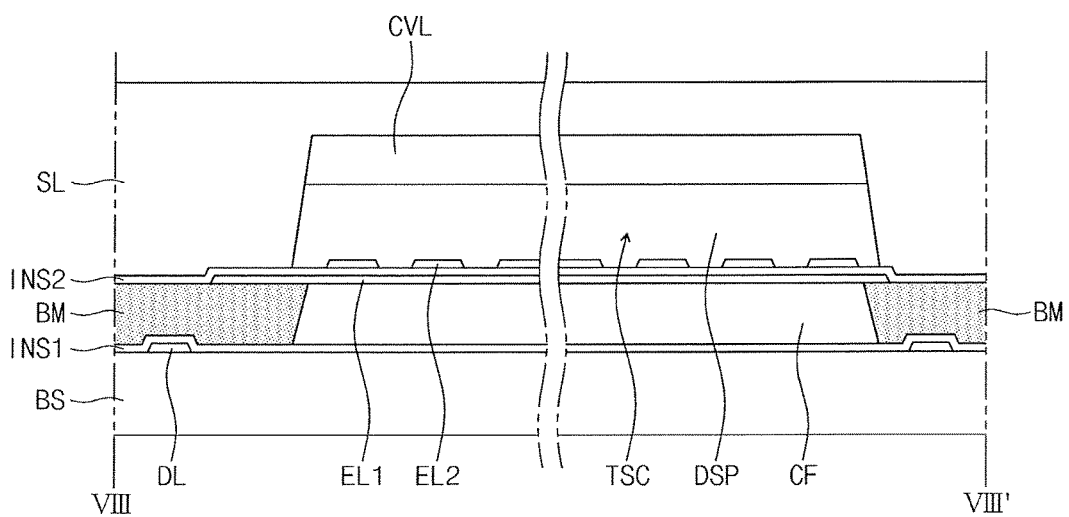

Referring to FIG. 18 and FIGS. 22A and 22B, the image display part DSP, e.g., a liquid crystal layer including liquid crystal is formed in the TSC (S280). Since the liquid crystal is provided in the form of a fluid, the liquid crystal may migrate into the TSC when the liquid crystal is supplied to a place adjacent to the TSC due to the capillary phenomenon. According to an embodiment, the liquid crystals can be supplied to a place adjacent to the TSC through an inkjet scheme by using a micropipette or supplied into the TSC by using a vacuum injection device. When the liquid crystal is supplied into the TSC by using the vacuum injection device, a part of the base substrate BS, where the TSC is formed, is immersed in a container filled with liquid crystal and provided in a chamber, and the pressure of the chamber is lowered, so that the liquid crystal is supplied into the TSC due to the capillary phenomenon.

Next, the liquid crystal is removed from an area except the TSC and a sealing layer SL is formed to seal the TSC (S290). The sealing layer seals openings of the TSC through which the liquid crystal enters according to the capillary action.

The sealing layer SL is formed by using a semi-cured polymer material. The polymer material has a predetermined degree of fluidity before the polymer material is completely cured. To form the sealing layer SL, the polymer material is formed in a plate-shape having a predetermined thickness such that the polymer material can cover the base substrate BS. Then, the plate-shape polymer material is placed on the base substrate BS, and pressure is applied onto the plate-shape polymer material. Since the polymer material has the degree of fluidity, the polymer material can be provided in the recess formed in the base substrate BS. The polymer material contacts the top surface of the cover layer CVL, the sides of the image display part DSP, and the top surface of the second insulating layer INS2, so that the image display material, such as the liquid crystal, is entrapped in the TSC. The semi-cured polymer material is hard-baked later and cured entirely.

According to an embodiment of the present invention, the number of base substrates and the amount of liquid crystal used in the display apparatus having the above structure can be reduced by about a half as compared with those of the conventional display apparatus. According to the conventional liquid display, two opposite base substrates are provided, and a liquid crystal layer is interposed between the two opposite base substrates. However, according to an embodiment of the present invention, one base substrate is used. Since the liquid crystal is formed on a part of the base substrate, the amount of the liquid crystal used in the display apparatus can be reduced.

Since the sacrificial layer is easily removed by using an etchant for a positive or negative type photo-resist, an additional process for removing the sacrificial layer is not necessary.

The wet etching scheme may provide higher etching uniformity compared to dry etching schemes, such as a plasma etching process, so that a larger size of display apparatuses may be easily manufactured. In the conventional structure where the color filter and the black matrix are formed on the sacrificial layer, a protection layer is formed to avoid damage to the color filter and the black matrix during the dry etching process. Since the protective layer is formed by photolithography using a mask after the gate pad part and data pad part are formed, manufacturing the conventional display apparatus increases costs and time. According to an embodiment of the present invention, since the color filter and the black matrix are formed before the sacrificial layer, the gate pad part, and the data pad part are formed, no additional mask is used, resulting in decreased costs and time and simplified process.

Forming the TSC and the image display part and sealing the TSC are carried out at a relatively lower temperature than in the conventional method.

Different from the conventional liquid crystal display, in which the spacer is formed to adjust the gap between two base substrates before the two base substrates are combined with each other, a liquid crystal display according to an embodiment of the present invention can omit the spacer. Thus, the process for forming the spacer can be omitted, so that the manufacturing time and costs may be further reduced.

The display apparatus according to an embodiment can reduce the manufacturing time and costs as compared with the conventional display apparatus since the process for combining two base substrates can be omitted.

Figure 23A:
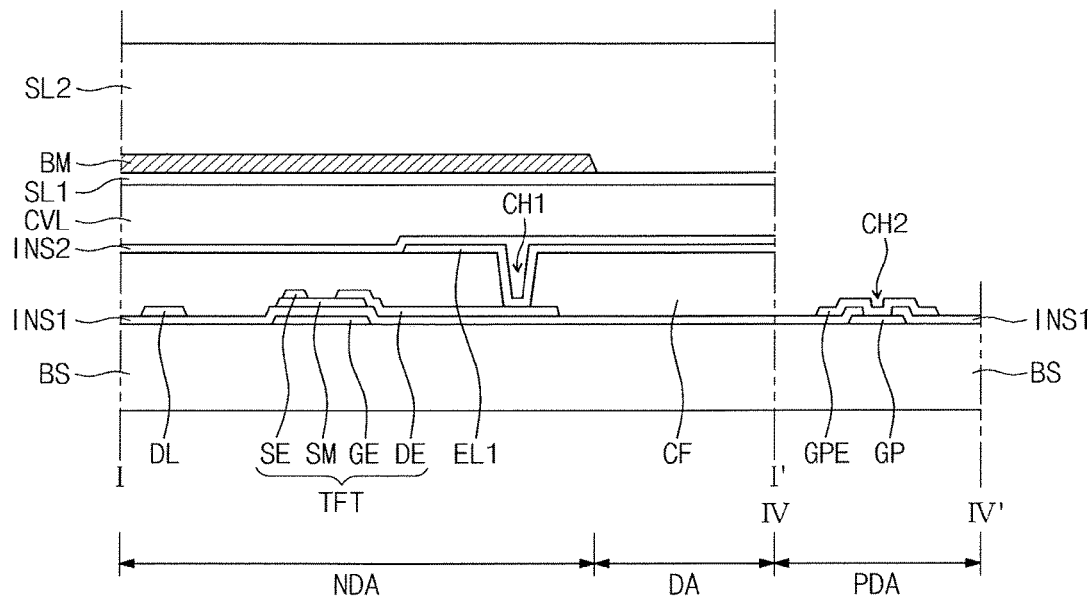
FIGS. 23A, 23B, and 23C are sectional views showing a display apparatus according to an embodiment of the present invention.
Figure 23B:
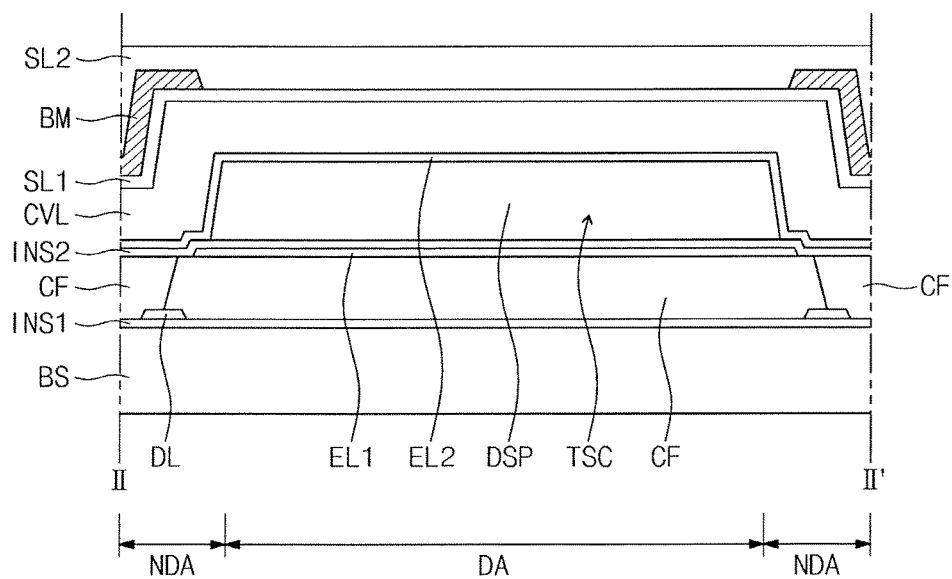
Figure 23C:
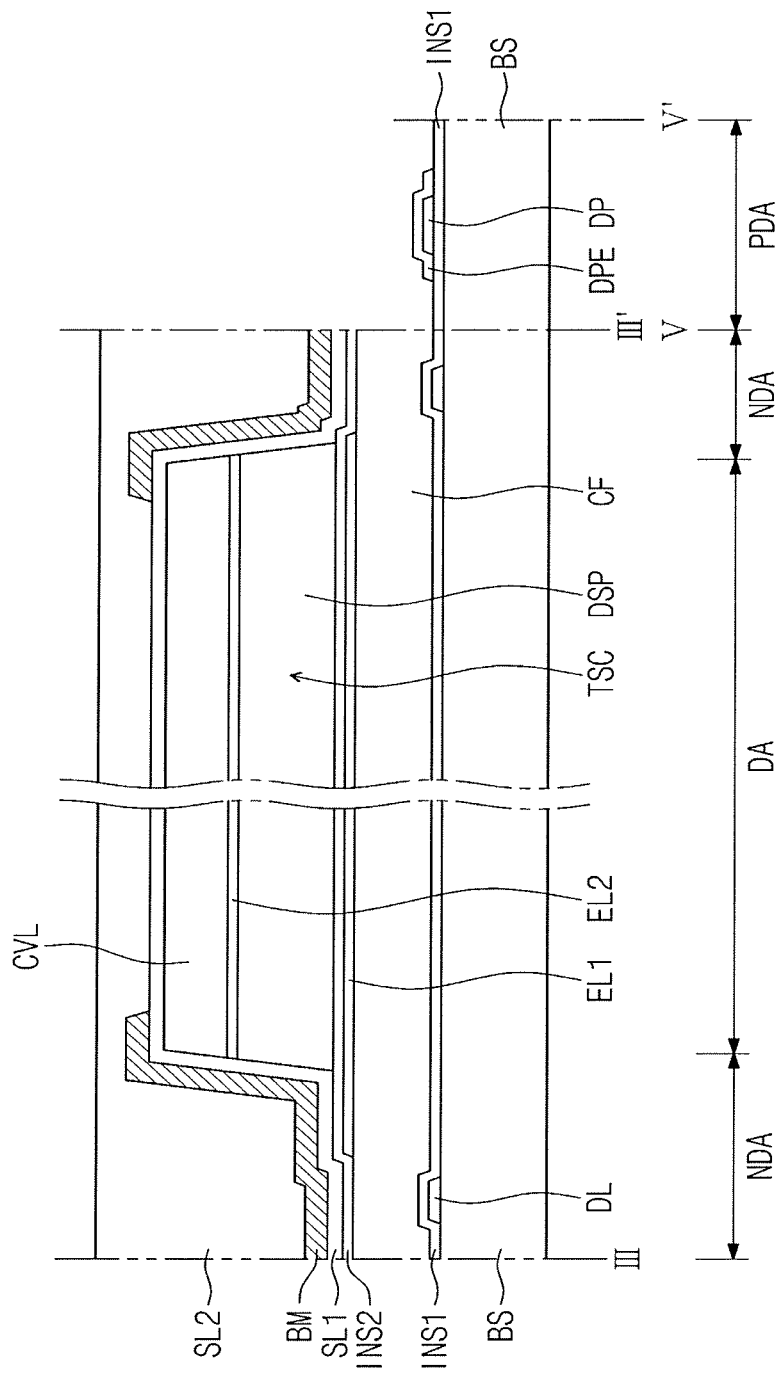

FIGS. 23A, 23B, and 23C are sectional views showing a display apparatus according to an embodiment of the present invention. FIGS. 23A, 23B, and 23C are respectively sectional views taken along lines I-I' and IV-IV', line II-II', lines III-III' and V-V' of FIG. 1A. According to an embodiment of the present invention, the display apparatus includes a black matrix on the pixel.

Referring to FIGS. 1A, 23A, 23B, and 23C, the display apparatus includes a base substrate BS, a color filter CF on the base substrate BS, a pixel PX on the color filter CF, and a black matrix BM on the pixel PX.

According to an embodiment, the base substrate BS is a transparent or opaque insulating base substrate and includes silicon, glass, or plastic. The base substrate BS includes a pixel area PA in which the pixels PX are arranged and a pad area PDA which is provided on at least one side of the pixel area PA. The pixel area PA includes a display area DA corresponding to a pixel PX and displaying an image, and a non-display area NDA which is provided on at least one side of the display area DA.

A wiring part through which signals are transferred and a thin film transistor TFT operating the pixel PX are provided on the base substrate BS.

A color filter CF is provided on the thin film transistor TFT. The color filter CF allows light passing through each pixel PX to provide a color. The color filter CF includes one of a red color filter, a green color filter, and a blue color filter and corresponds to a pixel of the pixel area PA. According to an embodiment, the color filter CF further includes another color filter having a color except red, green, and blue. For example, the color filter CF includes a white color filter. When a plurality of pixels PX are provided, a plurality of color filters CF are provided. The pixels PX having different colors are arranged so that the pixels PX adjacent to each other have different colors from each other. According to an embodiment, portions of the color filters CF adjacent to each other overlap each other at the border of the pixels PX.

A first contact hole CH1 is formed in the color filter CF and exposes a portion of the drain electrode DE of the thin film transistor TFT.

The pixel PX is provided on the base substrate BS, for example, on the color filter CF. The pixel PX includes a cover layer CVL which defines a TSC, an image display part DSP provided in the TSC, and a first and second electrodes EL1 and EL2 which controls the image display part DSP.

The first electrode EL1 is disposed on the color filter CF. The first electrode EL1 is connected with the thin film transistor TFT through the first contact hole CH1 in the color filter CF. A second insulating layer INS2 is disposed on the first electrode EL1 and protects the first electrode EL1.

The cover layer CVL is disposed on the first electrode EL1, substantially on the second insulating layer INS2 and extends in the first direction D1. The cover layer CVL, a portion of which is spaced apart from the color filter CF, defines the TSC together with the color filter CF.

The second electrode EL2 is disposed along a bottom surface of the cover layer CVL and extends in a same direction in which the cover layer CVL extends, e.g., the first direction D1. The pixels PX arranged in the extending direction share the second electrode E2.

The image display part DSP is formed in the TSC. For example, the image display part DSP is disposed between the first electrode EL1 and the second electrode EL2, and is controlled by an electric field which the first electrode EL1 and the second electrode form to display an image.

A first sealing layer SL1 is disposed on the cover layer CVL. The first sealing layer SL1 covers the pixel area PA. The first sealing layer SL1 covers the display area DA and the non-display area NDA rather than pad area PDA. The first sealing layer SL1 seals two openings at two sides of the TSC to seal the TSC. The TSC is sealed by the second insulating layer INS2 (when the second insulating layer INS2 is not provided, the first electrode EL1), the second electrode EL2, and the first sealing layer SL1.

A black matrix BM is disposed on the first sealing layer SL1 in the non-display area NDA. The black matrix BM is formed in an area corresponding to where color filters CF adjacent to each other overlap each other and blocks unnecessary light. The black matrix BM also blocks light leakages caused by abnormal behaviors of liquid crystal and decreases color mixing defects caused by two adjacent color filters CF overlapping each other at the border of the pixels PX.

A second sealing layer SL2 is disposed on the base substrate BS where the first sealing layer SL1 and the black matrix BM are formed and protects the elements below the second sealing layer SL2.

Hereinafter, a method of manufacturing the display apparatus shown in FIGS. 23A, 23B, and 23C are described with reference to FIGS. 24 to 35B.

Figure 24:
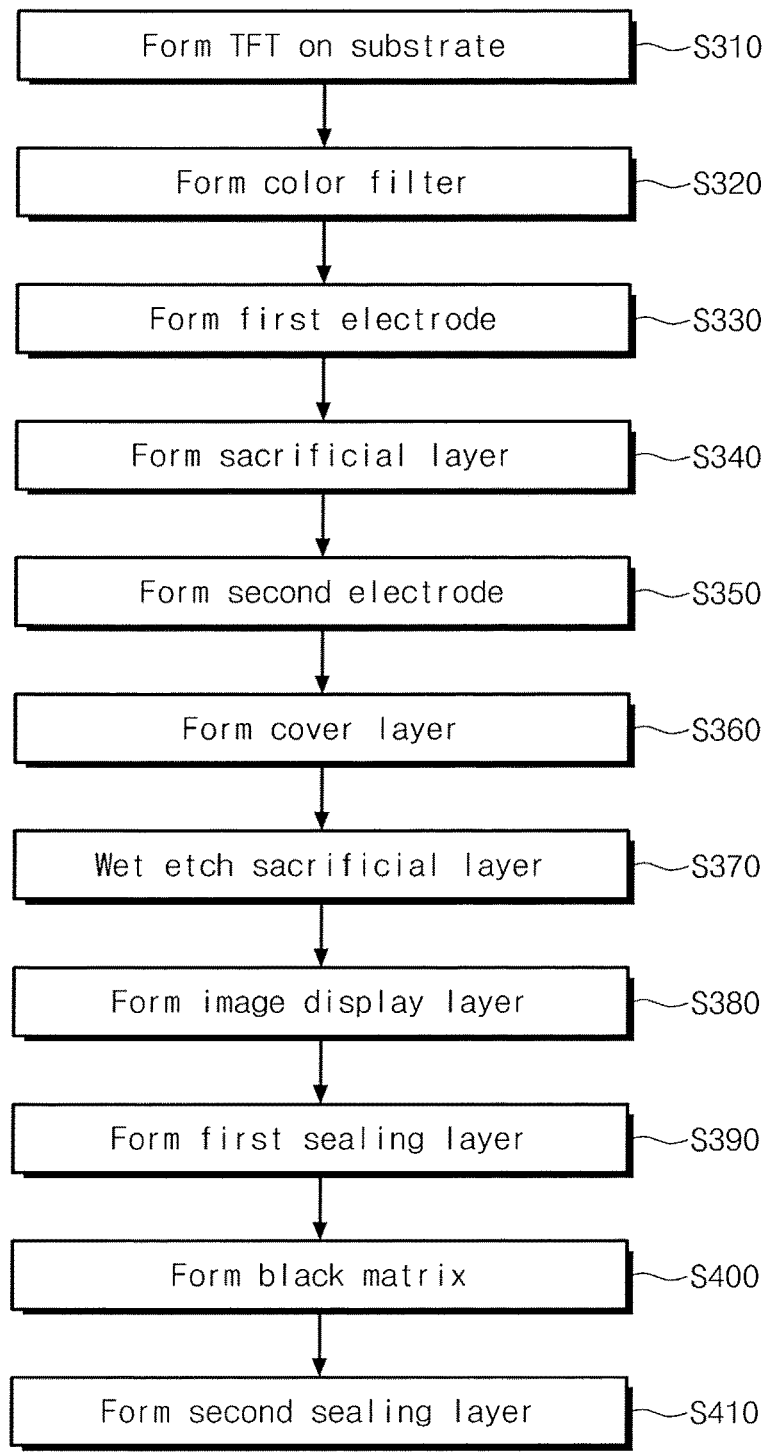
FIG. 24 is a flowchart showing a method of manufacturing a display apparatus according to an embodiment of the present invention.

FIG. 24 is a flowchart showing a method of manufacturing a display apparatus as shown in FIGS. 23A, 23B, and 23C.

Referring to FIG. 24, a thin film transistor TFT and a color filter CF are formed on a base substrate BS (S310, S320). Next, a first electrode EL1, a sacrificial layer SCR_N, a second electrode EL2, and a cover layer CVL are sequentially formed on the color filter CF (S330, S340, S350, S360). The sacrificial layer SCR_N is then removed (S370). After an image display part DSP is formed (S380), a first sealing layer SL1 is formed to seal the image display part DSP (S390). Then, a black matrix BM and a second sealing layer SL2 are sequentially formed (S300, S310).

Figure 25:
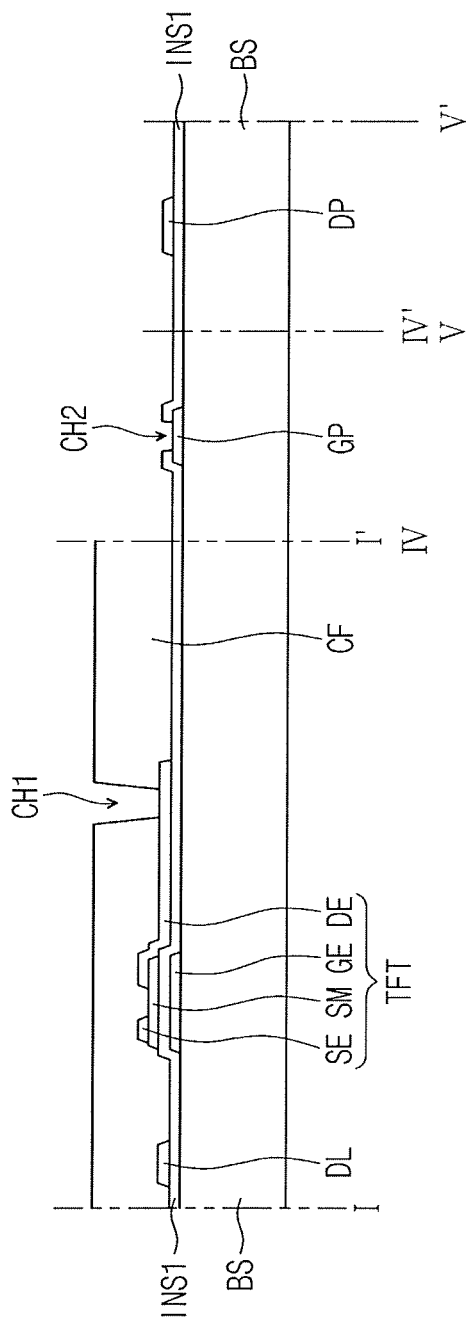
Figure 26:
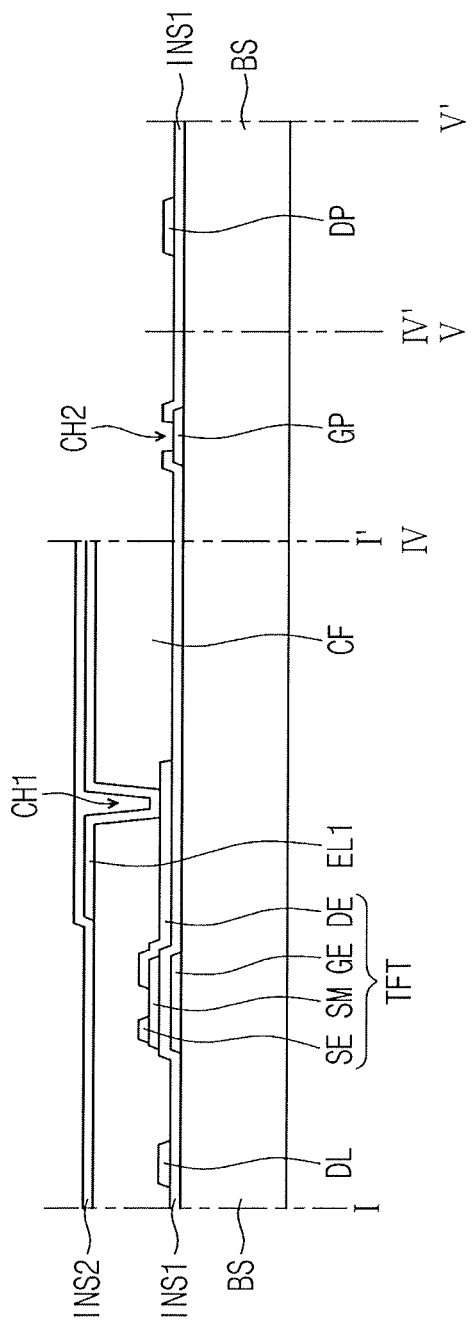

FIGS. 25, 26, 27A to 35A, and 27b to 35b are sectional views showing a display apparatus as shown in FIGS. 23A, 23B, and 23C. FIGS. 25 and 26 are sectional views taken along lines I-I', IV-IV', and V-V' of FIG. 1B, FIGS. 27A, 28A, 29A, 30A, 31A, 32A, 32A, 33A, 34A, and 35A are sectional views taken along line II-II' of FIG. 1B, and FIGS. 27B, 28B, 29B, 30B, 31B, 32B, 33B, 34B, and 35B are sectional views taken along line of III-III' of FIG. 1B.

Referring to FIG. 24 and FIG. 25, a color filter CF is formed (S320) on the base substrate BS where a gate wire, a semiconductor layer SM, and a data wire are formed (S310) and then a first contact hole CH1 to expose a portion of a drain electrode DE of the data wire and a second contact hole CH2 to expose a portion of a gate pad GP of the gate wire are formed. The color filter CF is formed by forming a color layer having a color, such as red, green, or blue and patterning the color layer by photolithography.

Referring to FIG. 24 and FIG. 26, the first electrode EL1, a gate pad electrode GPE, and a data pad electrode DPE are formed on the color filter CF (S330). The first electrode EL1, the gate pad electrode GPE, and the data pad electrode DPE are formed by forming a conductive layer on the color filter CF and patterning the conductive layer by photolithography. An inorganic insulating layer INS2 is formed on the first electrode EL1 and protects the first electrode EL1.

Figure 27A:
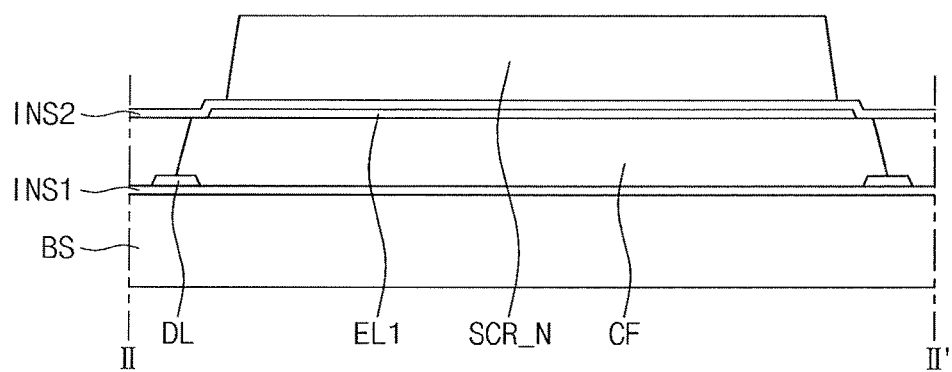
Figure 27B:
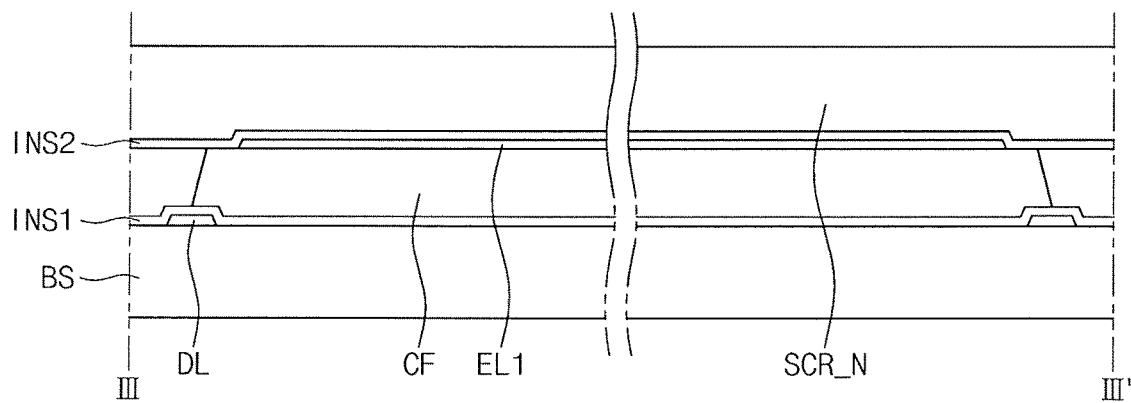

Referring to FIG. 24 and FIGS. 27A and 27B, the sacrificial layer SCR_N is formed on the second insulating layer INS2 (S340).

Figure 28A:
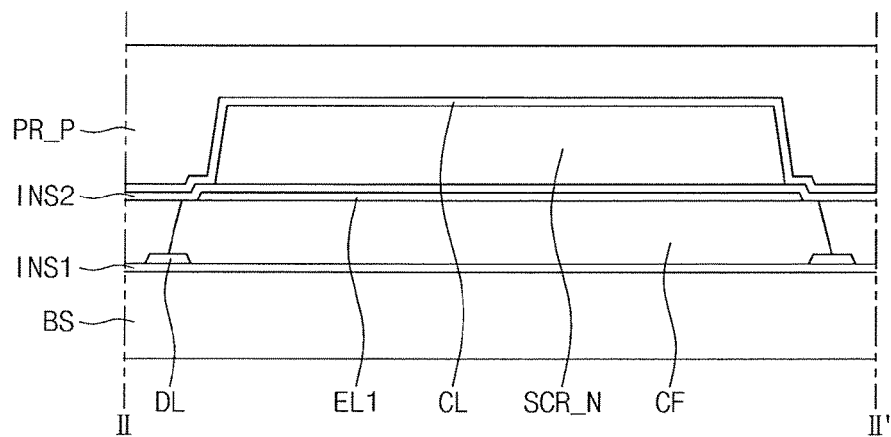
Figure 28B:
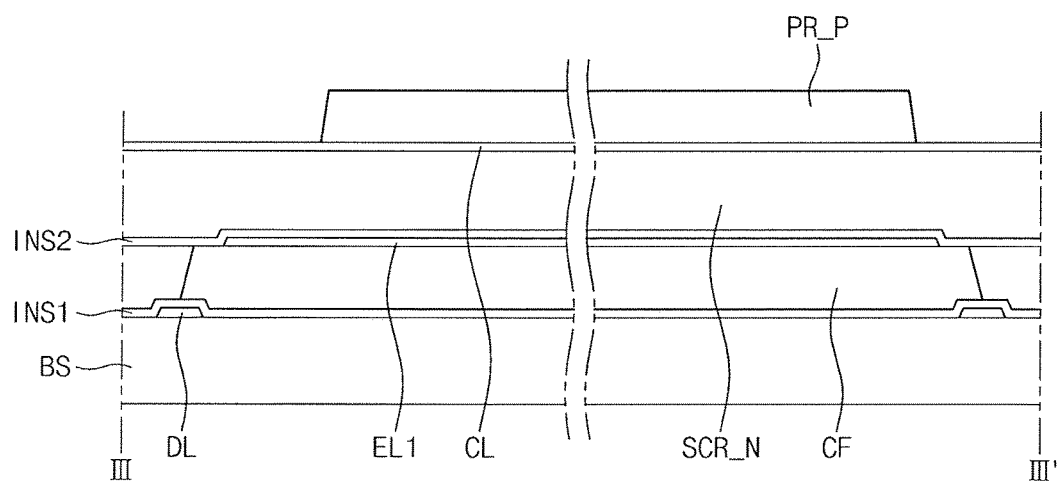

Referring to FIG. 24 and FIGS. 28A and 28B, a conductive layer and a photo-resist pattern PR_P are subsequently formed on the sacrificial layer SCR_N. The photo-resist pattern PR_P is formed by coating a photo-resist on the conductive layer, primarily exposing the photo-resist, and primarily developing the photo-resist.

Figure 29A:
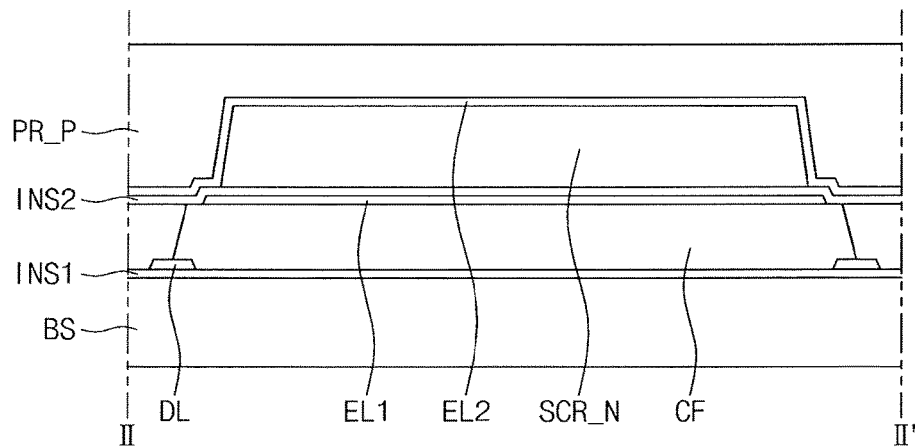
Figure 29B:
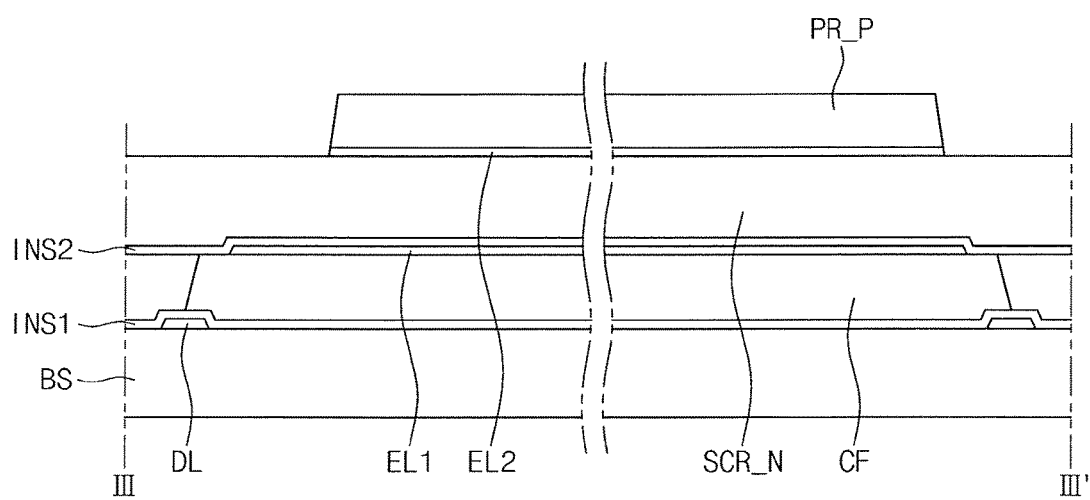

Referring to FIG. 24 and FIGS. 29A and 29B, the second electrode EL2 is formed on the sacrificial layer SCR_N (S350). The second electrode EL2 is formed by etching the conductive layer as the photo-resist pattern PR_P as a mask. The photo-resist pattern PR_P is formed by depositing a photo resist, primarily exposing the photo-resist, and then primarily developing the exposed photo-resist.

Figure 30A:
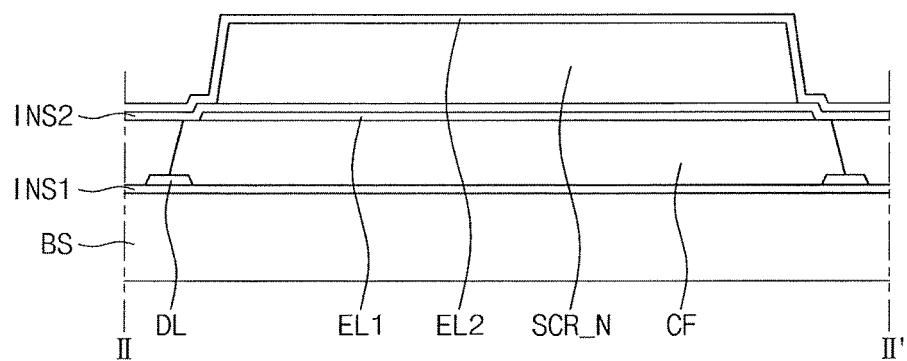
Figure 30B:
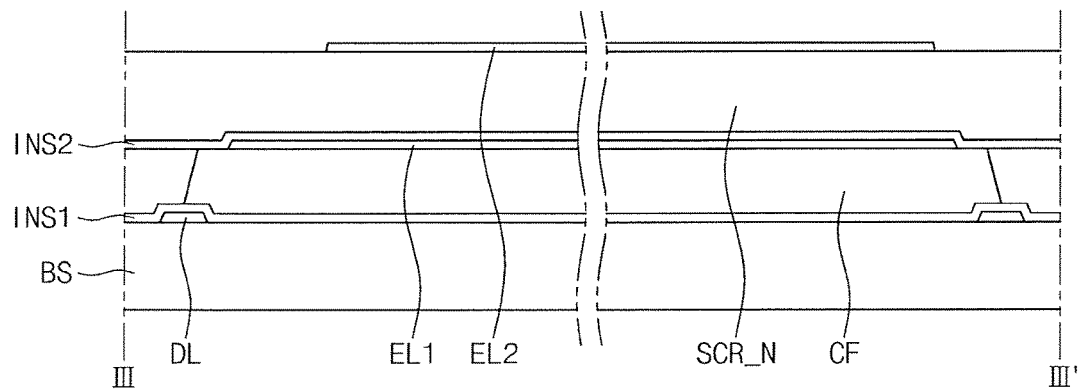

Referring to FIGS. 30A and 30B, the photo-resist pattern PR_P is removed by secondarily exposing and secondarily developing the photo-resist pattern PR_P.

Figure 31A:
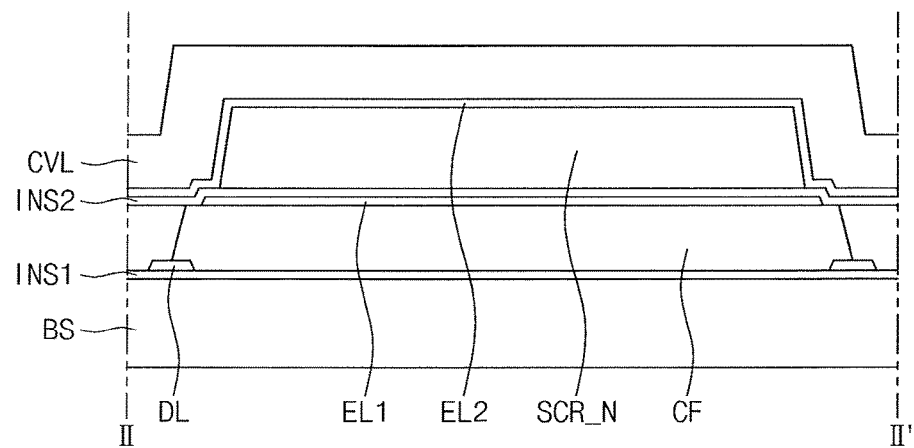
Figure 31B:
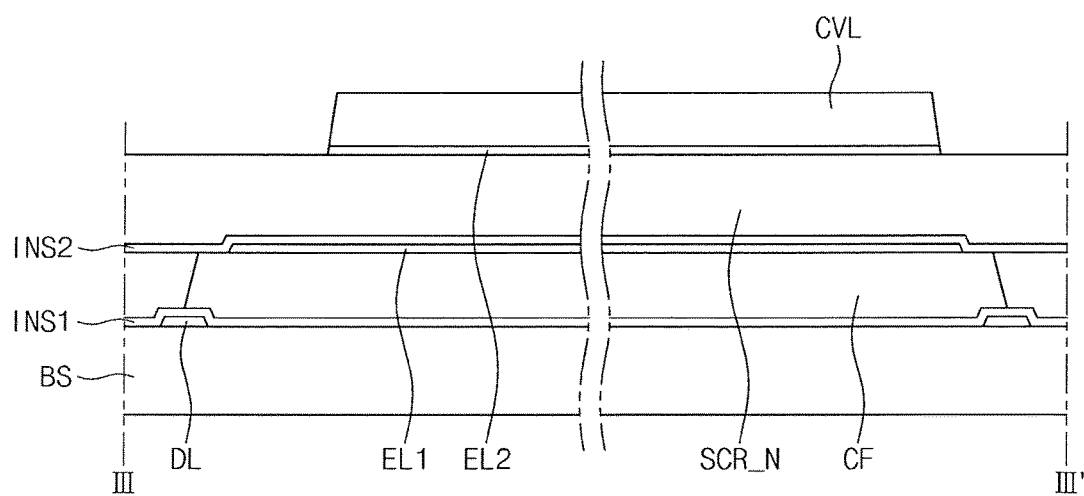

Referring to FIG. 24 and FIGS. 31A and 31B, the cover layer CVL is formed on the base substrate BS where the second electrode EL2 is formed (S360). The cover layer CVL extends in the first direction D1 and covers the second electrode EL2.

Figure 32A:
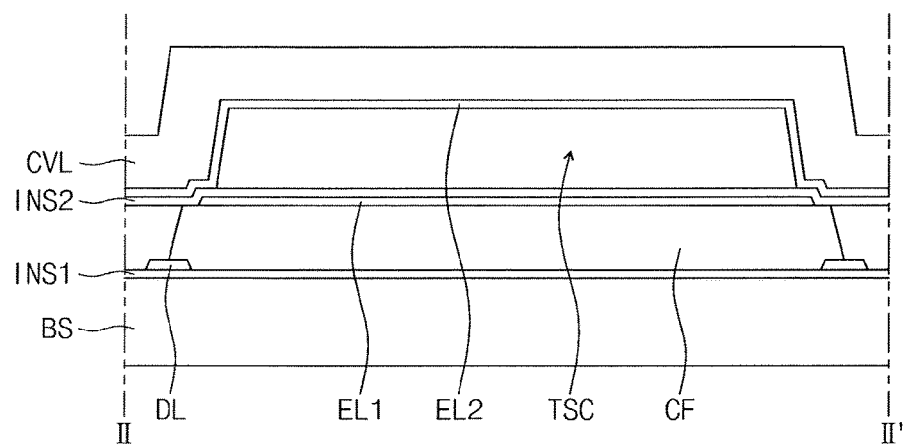
Figure 32B:
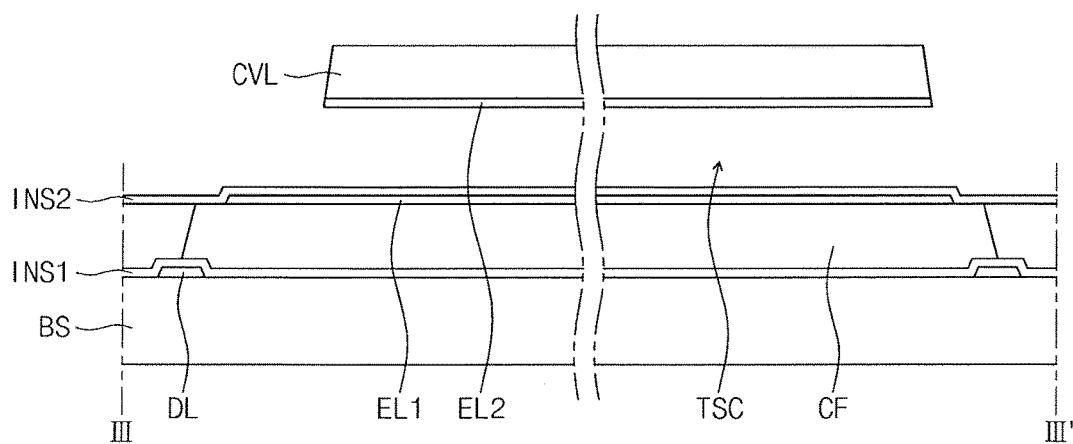

Referring to FIG. 24 and FIGS. 32A and 32B, the sacrificial layer SCR_N is removed by a wet-etching process to form a TSC (S370).

Figure 33A:
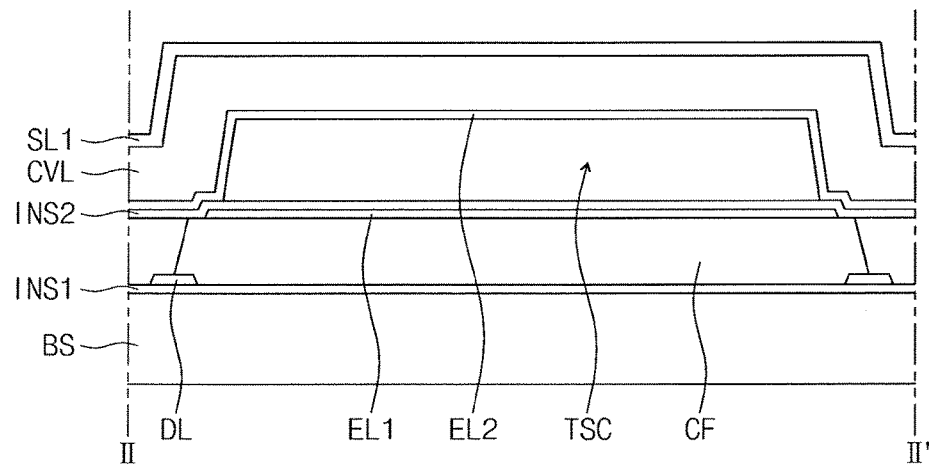
Figure 33B:
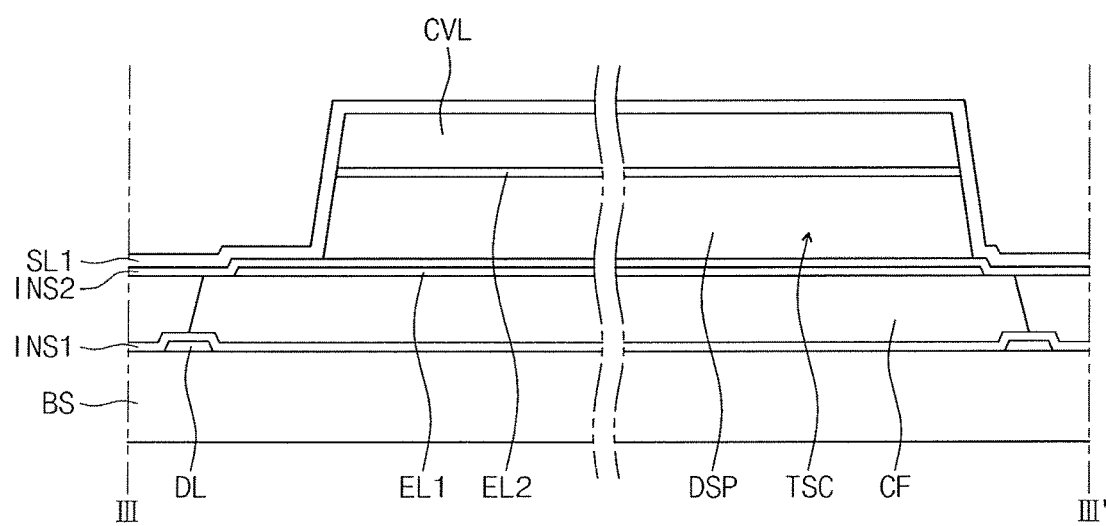

Referring to FIG. 24 and FIGS. 33A and 33B, the image display part DSP, such as a liquid crystal layer including liquid crystal, is formed in the TSC (S380). Next, the liquid crystal is removed from an area except in the TSC and the first sealing layer SL1 is formed to seal the TSC (S390). The first sealing layer SL1 seals openings of the TSC through which the liquid crystal is injected according to the capillary action.

Figure 34A:
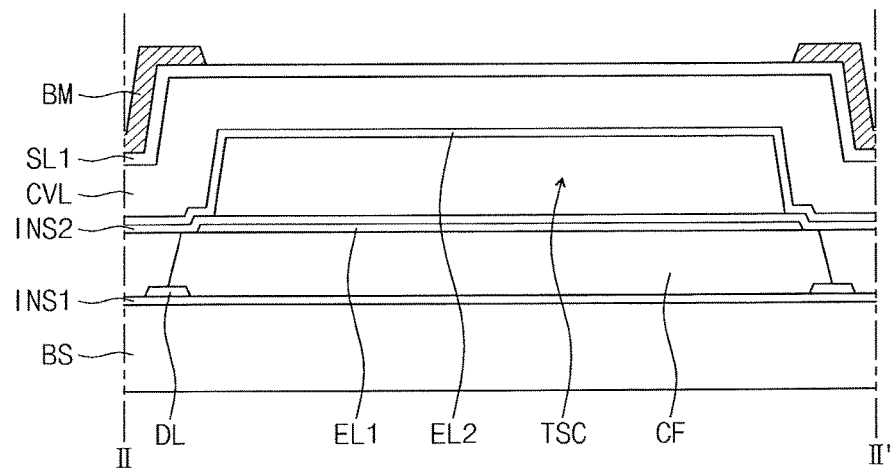
Figure 34B:
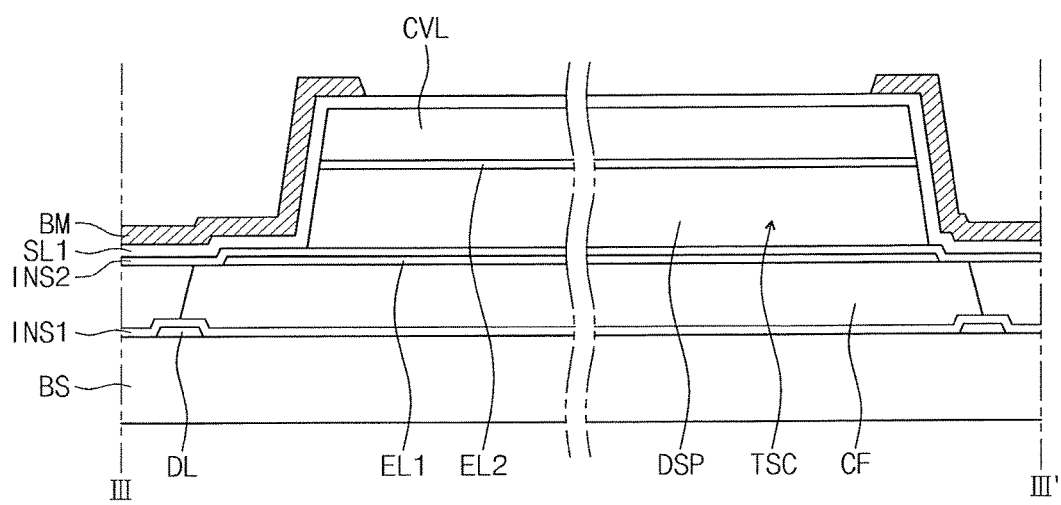

Referring to FIG. 24 and FIGS. 34A and 34B, the black matrix BM is formed on the base substrate BS where the first sealing layer SL1 is formed (S400). The black matrix BM is formed by forming a light blocking layer and then patterning the light blocking layer using photolithography. The method of forming the black matrix BM is not limited thereto. Alternatively, for example, an ink-jet scheme is used instead of the photolithography.

Figure 35A:
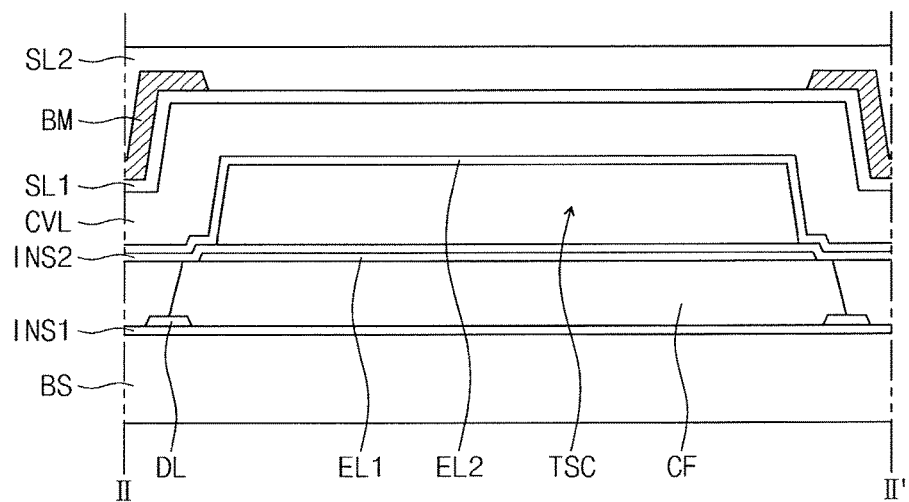
Figure 35B:
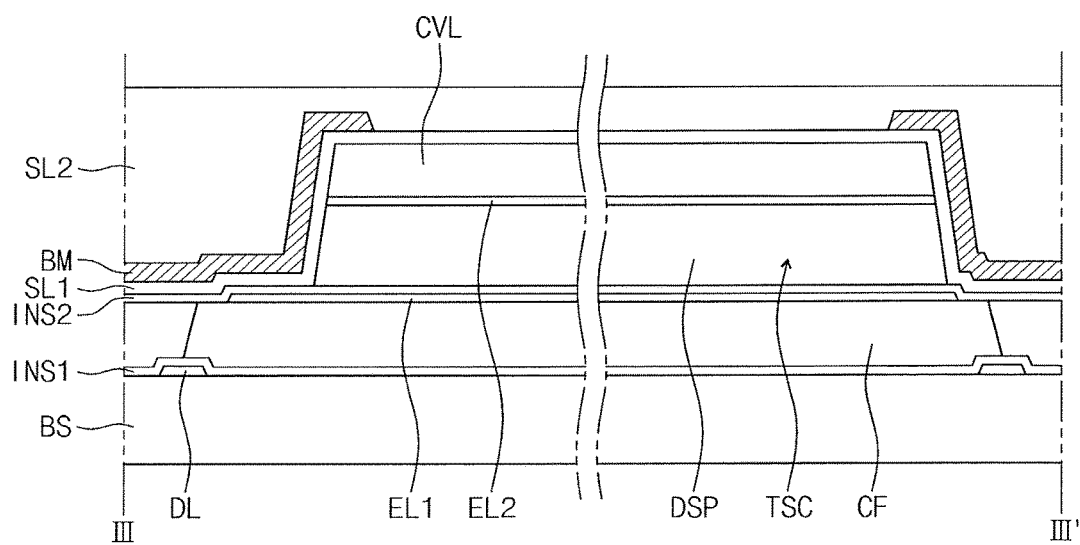

Referring to FIGS. 35A and 35B, the second sealing layer SL2 is formed on the base substrate BS where the first sealing layer SL1 and the black matrix BM are formed.

According to the embodiments of the present invention, the black matrix is formed over the color filter, and the black matrix does not directly overlap the color filter. As a consequence, unevenness in an area where the color filter and the black matrix overlap each other and abnormal behaviors of the liquid crystal caused by the unevenness may be prevented, resulting in an increase in the display area.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a display apparatus, the method comprising:
    forming a first electrode on a base substrate;
    forming a sacrificial layer extending in a first direction on the first electrode;
    forming a second electrode on the sacrificial layer, the second electrode extending in a second direction crossing the first direction;
    forming a cover layer on the second electrode;
    wet-etching the sacrificial layer to form a cavity;
    forming an image display part in the cavity; and
    forming an insulating layer on the second electrode, wherein the insulating layer is configured to seal the cavity.

2. The method of claim 1, further comprising forming a color filter part, the color filter part comprising a color filter and a black matrix.

3. The method of claim 1, wherein the forming the second electrode comprises:
    forming a conductive layer on the sacrificial layer;
    forming a positive type photo-resist on the conductive layer;
    exposing and developing the photo-resist to form a photo-resist pattern;
    patterning the conductive layer using the photo-resist pattern as a mask; and
    removing the photo-resist pattern.

4. The method of claim 3, wherein the sacrificial layer comprises a negative type photo-resist.

5. The method of claim 4, wherein the cover layer comprises a positive type photo-resist.

6. The method of claim 3, further comprising soft-baking the cover layer.

7. A method of manufacturing a display apparatus, the method comprising:
    forming a color filter part comprising a color filter and a black matrix;
    forming a pixel on the color filter part;
        forming an electrode part comprising first and second electrodes insulated from each other;
        forming a sacrificial layer extending in a first direction on the electrode part;
        forming a cover layer on the sacrificial layer, the cover layer extending in a second direction crossing the first direction;
        wet-etching the sacrificial layer to form a cavity between the electrode part and the cover layer;
        forming an image display part in the cavity; and
        forming a sealing layer to cover the cover layer and to seal the cavity.

8. The method of claim 7, wherein the sacrificial layer comprises a positive type photo-resist.

9. The method of claim 8, wherein the cover layer comprises a negative type photo-resist.

10. The method of claim 9, further comprising hard-baking the sealing layer.

* * * * *